(12) United States Patent
Takemura et al.

(10) Patent No.: US 6,511,785 B1
(45) Date of Patent: Jan. 28, 2003

(54) CHEMICALLY AMPLIFIED POSITIVE RESIST COMPOSITION AND PATTERNING METHOD

(75) Inventors: Katsuya Takemura, Nakakubiki-gun (JP); Kenji Koizumi, Nakakubiki-gun (JP); Tatsushi Kaneko, Nakakubiki-gun (JP); Toyohisa Sakurada, Nakakubiki-gun (JP)

(73) Assignee: Shin Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 09/709,629

(22) Filed: Nov. 13, 2000

(30) Foreign Application Priority Data

Nov. 12, 1999 (JP) .......................... 11-323332

(51) Int. Cl.[7] .......................... G03C 1/73; G03F 7/039; G03F 7/30; G03F 7/38; G03F 7/40
(52) U.S. Cl. .......................... 430/270.1; 430/281.1; 430/905; 430/909; 430/910; 430/914; 430/326; 430/327; 430/330; 430/311
(58) Field of Search .......................... 430/281.1, 270.1, 430/326, 327, 330, 910, 905, 914, 311, 909

(56) References Cited

U.S. PATENT DOCUMENTS

| 4,491,628 A | 1/1985 | Ito et al. |
| 4,603,101 A | 7/1986 | Crivello |
| 5,015,554 A | 5/1991 | Ruckert et al. .......... 430/270.1 |
| 5,252,435 A | 10/1993 | Tani et al. |
| 5,324,804 A | 6/1994 | Steinmann |
| 5,496,678 A | 3/1996 | Imai et al. .................. 430/176 |
| 5,942,367 A | 8/1999 | Watanabe et al. |
| 6,027,854 A | * 2/2000 | Nishi et al. .............. 430/270.1 |
| 6,114,462 A | 9/2000 | Watanabe et al. |
| 6,123,992 A | * 9/2000 | Sugai ........................ 427/250 |

FOREIGN PATENT DOCUMENTS

| JP | 62-115440 | 5/1987 |
| JP | 63-27829 | 2/1988 |
| JP | 2-27660 | 6/1990 |
| JP | 3-223858 | 10/1991 |
| JP | 4-211258 | 8/1992 |
| JP | 6-100488 | 4/1994 |
| JP | 10-207066 | 8/1998 |

OTHER PUBLICATIONS

Yamaoka et al, *Design of Photoresist Based on Diverse Reaction of Polyfunctional Vinyl Ether Monomers*, Polymeric Materials Science & Engineering, (1999) vol. 81, p. 55, Aug. 22–Aug. 26, 1999.*
English Abstract of JP 63–27829.
English Abstract of JP 4–211258.
Derwent WPI JP 63–149640 (1988–06–22).
Derwent WPI JP 06 161110 (1994–06–07).

* cited by examiner

Primary Examiner—Janet Baxter
Assistant Examiner—Sin J. Lee
(74) Attorney, Agent, or Firm—Millen, White, Zelano & Branigan, P.C.

(57) ABSTRACT

A chemically amplified positive resist composition comprising a base resin and a compound containing two to six functional groups, specifically alkenyloxy, acetal and orthoester groups in the molecule is suitable for forming a contact hole pattern by the thermal flow process.

17 Claims, 2 Drawing Sheets

CHEMICALLY AMPLIFIED POSITIVE RESIST COMPOSITION AND PATTERNING METHOD

TECHNICAL FIELD

This invention relates to a chemically amplified positive resist composition for forming a contact hole pattern by the thermal flow process. While a method for forming a contact hole pattern using a chemically amplified positive resist composition comprising a polymer as the base resin involves the thermal flow step of heat treating the contact hole pattern for further reducing the size of contact holes, the invention relates to the resist composition to which a compound having functional groups capable of crosslinking with the polymer is added so that the size reduction by thermal flow becomes easy to control. The invention also relates to a method for forming a microsize contact hole pattern in the manufacture of VLSIs.

BACKGROUND ART

While a number of recent efforts are being made to achieve a finer pattern rule in the drive for higher integration and operating speeds in LSI devices, deep-ultraviolet lithography is thought to hold particular promise as the next generation in microfabrication technology. Deep-UV lithography is capable of achieving a minimum feature size of 0.3 µm or less and, when a resist having low light absorption is used, can form patterns with sidewalls that are nearly perpendicular to the substrate.

Recently developed acid-catalyzed chemically amplified positive resists, such as those described in JP-B 2-27660, JP-A 63-27829, U.S. Pat. Nos. 4,491,628 and 5,310,619, utilize a high-intensity KrF or ArF excimer laser as the deep-UV light source. These resists, with their excellent properties such as high sensitivity, high resolution, and good dry etching resistance, are especially promising for deep-UV lithography.

Such chemically amplified positive resist compositions include two-component systems comprising a base resin and a photoacid generator, and three-component systems comprising a base resin, a photoacid generator, and a dissolution regulator having acid labile groups.

For example, JP-A 62-115440 describes a resist composition comprising poly-4-tert-butoxystyrene and a photoacid generator, and JP-A 3-223858 describes a similar two-component resist composition comprising a resin bearing tert-butoxy groups within the molecule, in combination with a photoacid generator. JP-A 4-211258 describes a two-component resist composition which is comprised of poly-hydroxystyrene bearing methyl, isopropyl, tert-butyl, tetrahydropyranyl, and trimethylsilyl groups, together with a photoacid generator.

JP-A 6-100488 discloses a resist composition comprising a polydihydroxystyrene derivative, such as poly[3,4-bis(2-tetrahydropyranyloxy)styrene], poly[3,4-bis(tert-butoxycarbonyloxy)styrene] or poly[3,5-bis(2-tetrahydropyranyloxy)styrene], and a photoacid generator.

Improvement and development efforts have been continuously made on the base resin in resist compositions of this type. JP-A 10-207066 discloses a resist composition comprising a base resin which is crosslinked with crosslinking groups having C—O—C linkages and a photoacid generator wherein the crosslinking groups are eliminated under the action of acid generated from the photoacid generator upon exposure, achieving a high contrast and high resolution.

Even when any base resin designed to enhance the resolving power is used in such chemically amplified positive resist compositions, it is yet difficult to reach a contact hole size of 0.20 µm or less. There are available no resist compositions for forming a contact hole pattern satisfying the requirement of LSI devices of the next generation.

On the other hand, the known technology of forming a contact hole size of 0.20 µm or less is to heat treat a contact hole pattern for causing the resist film to flow and reducing the contact hole size. This technology is known as thermal flow process. The use of the thermal flow process enables formation of a miniature contact hole size as fine as 0.10 µm or 0.15 µm.

In forming microsize contact holes by the thermal flow process, however, it is very difficult to control the heat treating temperature so as to provide a shrinkage matching with the desired contact hole size. That is, the thermal flow process has the drawback that even a slight variation of heating temperature brings about a substantial variation of contact hole size.

Referring to FIG. 1, there is illustrated in cross section a resist film 2 on a substrate 1, a contact hole 3 being formed through the resist film 2. The contact hole having undergone the thermal flow process has a profile as shown in FIG. 1, that is, a cross-sectional profile bowed at corners. The thermal flow process also has the problem that the profile of a contact hole is deteriorated.

SUMMARY OF THE INVENTION

An object of the invention is to provide a novel and improved chemical amplification type, positive working resist composition which has controllable process adaptability relative to the heat treating temperature when a microsize contact hole pattern is conventionally formed by the thermal flow process, and thus s has satisfactory practical utility. Another object is to provide a novel and improved method for forming a contact hole pattern.

It has been fount that when a contact hole pattern is formed by the thermal flow process using a chemically amplified positive resist composition comprising a compound containing at least two functional groups of the general formulas (1)-a to (1)-c in a molecule, the overall method is improved in process control and thus practically acceptable.

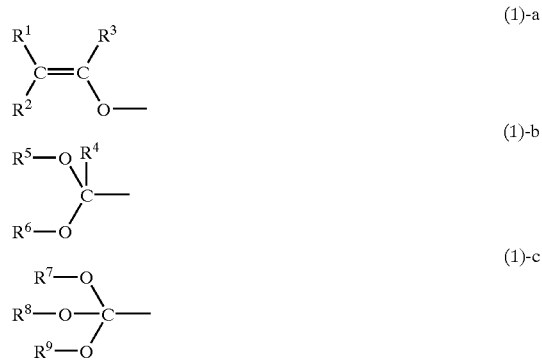

Herein $R^1$ to $R^4$ are hydrogen or straight, branched or cyclic alkyl groups of 1 to 12 carbon atoms, $R^5$ to $R^9$ are independently straight, branched or cyclic alkyl groups of 1 to 12 carbon atoms, and a pair of $R^1$ and $R^3$, a pair of $R^4$ and $R^5$, a pair of $R^5$ and $R^6$, a pair of $R^7$ and $R^8$, a pair of $R^7$ and $R^9$ or a pair of $R^8$ and $R^9$, taken together, may form a ring. For brevity sake, formulas (1)-a to (1)-c are sometimes referred to as formula (1), hereinafter.

Specifically, making the investigations to be described below, the inventor has established the method of controlling the thermal flow process.

In the inventor's experiment, a variety of base resins commonly used in conventional chemically amplified positive resist compositions were used to form resist films, which were provided with contact holes and subjected to the thermal flow process. The contact hole size was plotted relative to the heating temperature in a graph. It was found that the slope representing a change of contact hole size (to be referred to as a flow rate, hereinafter) was not so different among different base resins. Namely, changing the base resin skeleton gives no substantial difference in the flow rate. The flow rate remains substantially unchanged whether the base resin is a homopolymer or a copolymer and when the molecular weight or dispersity of the base resin is changed. This is also true when the acid labile group and other substituents are changed. The flow rate does not depend on the percent and type of substitution. Blending two or more distinct polymers brings little change of the flow rate. Through these investigations, it was found that only the flow initiation temperature, that is, the temperature at which the contact hole size becomes reduced changes with the base resin and depends on the glass transition temperature (Tg) of the base resin.

A summary of these findings can be illustrated in the graph of FIG. 2. In FIG. 2, curve I denotes a low molecular weight polymer, curve II denotes polymer A, curve III denotes polymer B, curve IV denotes a blend of polymer A and polymer B, curve V denotes a polymer having crosslinking groups, curve VI denotes a high molecular weight polymer, and curve VII denotes a polymer having a high Tg. The gradient of the curve represents the flow rate.

The flow rate can be numerically represented by a change of the contact hole size per degree centigrade of the heating temperature (unit: nm/°C.). While the base resin was changed among a variety of polymers, the flow rate did not substantially change. The change of contact hole size per degree centigrade was approximately 20 nm/°C. In the fabrication of LSI devices of the next generation targeting further miniaturization, the flow rate of 20 nm/°C. is difficult to control, inadequate to process adaptability, and by no means permissible.

Based on the above findings, the inventor made further investigations to find that when a contact hole pattern is formed by the thermal flow process using a chemically amplified positive resist composition comprising a compound containing at least two functional groups of the general formula (1) in a molecule, there are achieved a reduced flow rate, improved process control and practical utility.

By adding a compound containing at least two functional groups of the general formula (1) in a molecule to a chemically amplified positive resist composition, the flow rate in the thermal flow process, that is, the change of contact hole size per degree centigrade of heating temperature is improved as demonstrated in the graph of FIG. 3. In FIG. 3, curve A denotes a composition having the relevant compound added thereto and curve B denotes a control composition (free of the relevant compound).

When the compound containing at least two functional groups of the general formula (1) in a molecule is formulated together with a base resin in a chemically amplified positive resist composition, thermal crosslinking reaction can take place between the functional groups and the base resin. This thermal crosslinking reaction proceeds at the heat treating temperature during the thermal flow process, interfering with the rate at which the resist film is fluidized and thereby reducing the flow rate of contact holes. It is believed that the thermal crosslinking reaction of the compound containing at least two functional groups proceeds predominantly with phenolic hydroxyl groups on the base resin, but to some extent, with other sites on the base resin.

After a chemically amplified positive resist composition having the compound containing at least two functional groups of the general formula (1) in a molecule added thereto was used to form a resist film, which was provided with contact holes and-subjected to the thermal flow process, the resulting contact hole pattern configuration was observed. The contact hole pattern was improved in perpendicularity as compared with a control resist composition (without the compound containing at least two functional groups) yielding a contact hole pattern having rounded sidewalls at the end of thermal flow.

In summary, it has been found that the addition of the compound containing at least two functional groups of the general formula (1) is effective for reducing the flow rate associated with the thermal flow process of forming a microsize contact hole pattern and that the composition is effectively controllable and process adaptable in the fabrication of LSI devices of the next generation targeting further miniaturization.

Accordingly, the invention in a first aspect provides a chemically amplified positive resist composition for forming a contact hole pattern by the thermal flow process, comprising a compound containing at least two functional groups of the general formulas (1)-a to (1)-c in a molecule.

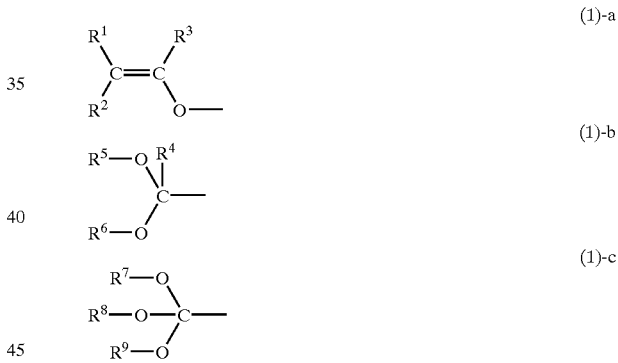

Herein $R^1$ to $R^4$ are independently hydrogen or straight, branched or cyclic alkyl groups of 1 to 12 carbon atoms, $R^5$ to $R^9$ are independently straight, branched or cyclic alkyl groups of 1 to 12 carbon atoms, and a pair of $R^1$ and $R^3$, a pair of $R^4$ and $R^5$, a pair of $R^5$ and $R^6$, a pair of $R^7$ and $R^8$, a pair of $R^7$ and $R^9$ or a pair of $R^8$ and $R^9$, taken together, may form a ring.

In one preferred embodiment, the compound containing at least two functional groups is of the general formula (2).

(2)

Herein Z is a functional group selected from the formulas (1)-a to (1)-c, the Z's may be the same or different, k is a positive integer of 2 to 6, and X is a k-valent organic group of 2 to 20 carbon atoms.

Typically the compound of the general formula (2) is present in an amount of 0.1 to 5% by mass of the overall resist composition.

In a second aspect, the invention provides a chemically amplified positive resist composition for forming a contact hole pattern by the thermal flow process, comprising (A) an organic solvent, (B) a base resin in the form of a polymer having acid labile groups, (C) a photoacid generator, (D) a basic compound, and (E) a compound containing at least two functional groups of the general formulas (1)-a to (1)-c in a molecule, as set forth above.

In one preferred embodiment, the base resin (B) is a polymer comprising recurring units of the following general formula (3) in which some of the hydrogen atoms of the phenolic hydroxyl groups are partially replaced by acid labile groups of at least one type, and some of the hydrogen atoms of the remaining phenolic hydroxyl groups are optionally eliminated for crosslinkage within a molecule and/or between molecules with crosslinking groups having C—O—C linkages, the total of the acid labile groups and the crosslinking groups being more than 0 mol % to 80 mol % of the entire hydrogen atoms of phenolic hydroxyl groups in the formula (3). The polymer has a weight average molecular weight of 1,000 to 500,000.

or a straight, branched or cyclic alkyl group of 1 to 10 carbon atoms, x is 0 or a positive integer of up to 5, y and z are positive integers satisfying $y+z \leq 5$, m and p are 0 or positive numbers, n is a positive number, satisfying $0 \leq m/(m+n+p) \leq 0.8$, $0 < n/(m+n+p) \leq 1$, and $0 \leq p/(m+n+p) \leq 0.8$.

In a further preferred embodiment, the base resin (B) is a polymer represented by the following general formula (4), that is a polymer comprising recurring units of the general formula (3) in which some of the hydrogen atoms of the phenolic hydroxyl groups are partially replaced by acid labile groups of at least one type, and some of the hydrogen atoms of the remaining phenolic hydroxyl groups are optionally eliminated for crosslinkage within a molecule and/or between molecules with crosslinking groups having C—O—C linkages, the total of the acid labile groups and the crosslinking groups being more than 0 mol % to 80 mol % of the entire hydrogen atoms of phenolic hydroxyl groups in formula (3). The polymer has a weight average molecular weight of 1,000 to 500,000.

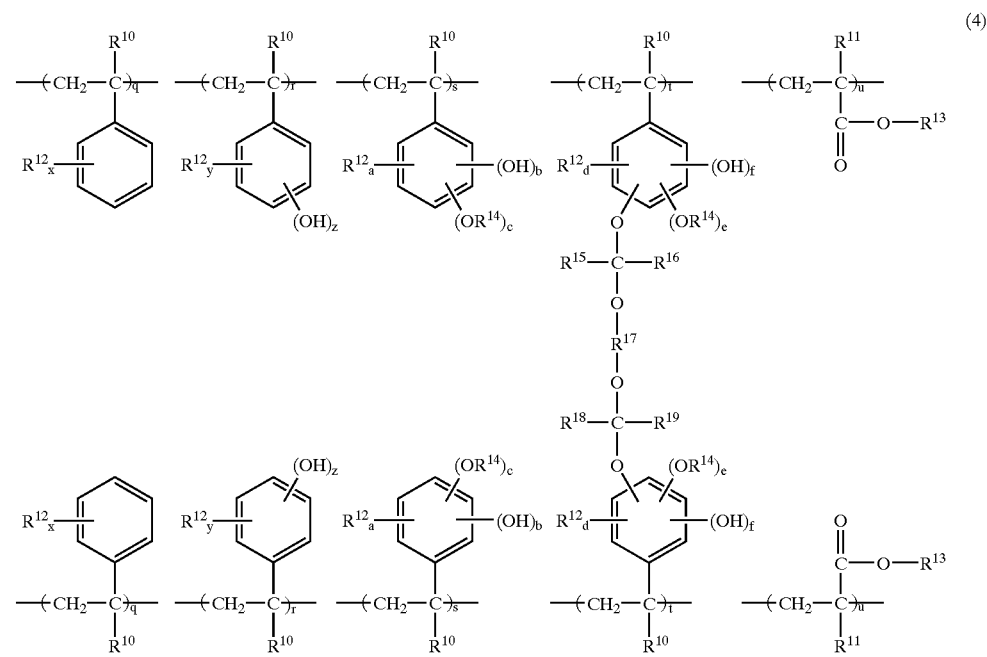

(4)

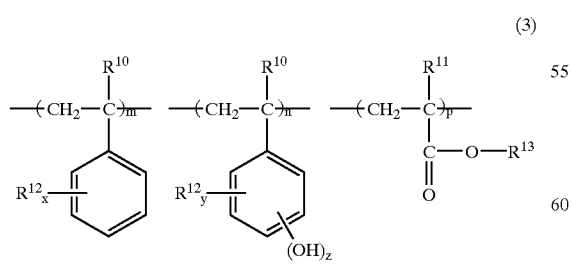

(3)

Herein $R^{10}$ is hydrogen or methyl, $R^{11}$ is hydrogen or a methyl, phenyl or cyano group, $R^{12}$ is a straight, branched or cyclic alkyl group of 1 to 8 carbon atoms, $R^{13}$ is hydrogen Herein
$R^{10}$ is hydrogen or methyl, $R^{11}$ is hydrogen or a methyl, phenyl or cyano group, $R^{12}$ is a straight, branched or cyclic alkyl group of 1 to 8 carbon atoms, $R^{13}$ is hydrogen or a straight, branched or cyclic alkyl group of 1 to 10 carbon atoms, $R^{14}$ is an acid labile group of at least one type, $R^{15}$, $R^{16}$, $R^{18}$ and $R^{19}$ are independently hydrogen or straight, branched or cyclic alkyl groups of 1 to 6 carbon atoms, and $R^{17}$ is a divalent or polyvalent hydrocarbon group of 1 to 10 carbon atoms which may be separated by an oxygen atom, each said unit may be constructed of one type or at least two types, x is 0 or a positive integer of up to 5, y and z are positive integers satisfying $y+z \leq 5$, a, b and c are positive integers satisfying $a+b+c \leq 5$, with the proviso that c is not equal to 0, d, e and f are 0 or positive integers satisfying $d+e+f \leq 4$, q, t and u are 0 or positive numbers, r and s are positive numbers, satisfying $0 \leq q/(q+r+s+t+u) \leq 0.8$, $0<s/(q+r+s+t+u) \leq 0.8$, $0 \leq t/(q+r+s+t+u) \leq 0.8$, $0 \leq u/(q+r+s+t+u) \leq 0.8$, $0<(r+s+t)/(q+r+s+t+u) \leq 1$, and $0<r/(q+r+s+t+u) \leq 0.8$.

In a further preferred embodiment, the base resin (B) is a polymer represented by the following general formula (5), that is a polymer comprising recurring units of the general formula (3) in which some of the hydrogen atoms of the phenolic hydroxyl groups are partially replaced by acid labile groups of at least one type, and some of the hydrogen atoms of the remaining phenolic hydroxyl groups are optionally eliminated for crosslinkage within a molecule and/or between molecules with crosslinking groups having C—O—C linkages, the total of the acid labile groups and the crosslinking groups being more than 0 mol % to 80 mol % of the entire hydrogen atoms of phenolic hydroxyl groups in formula (3). The polymer has a weight average molecular weight of 1,000 to 500,000.

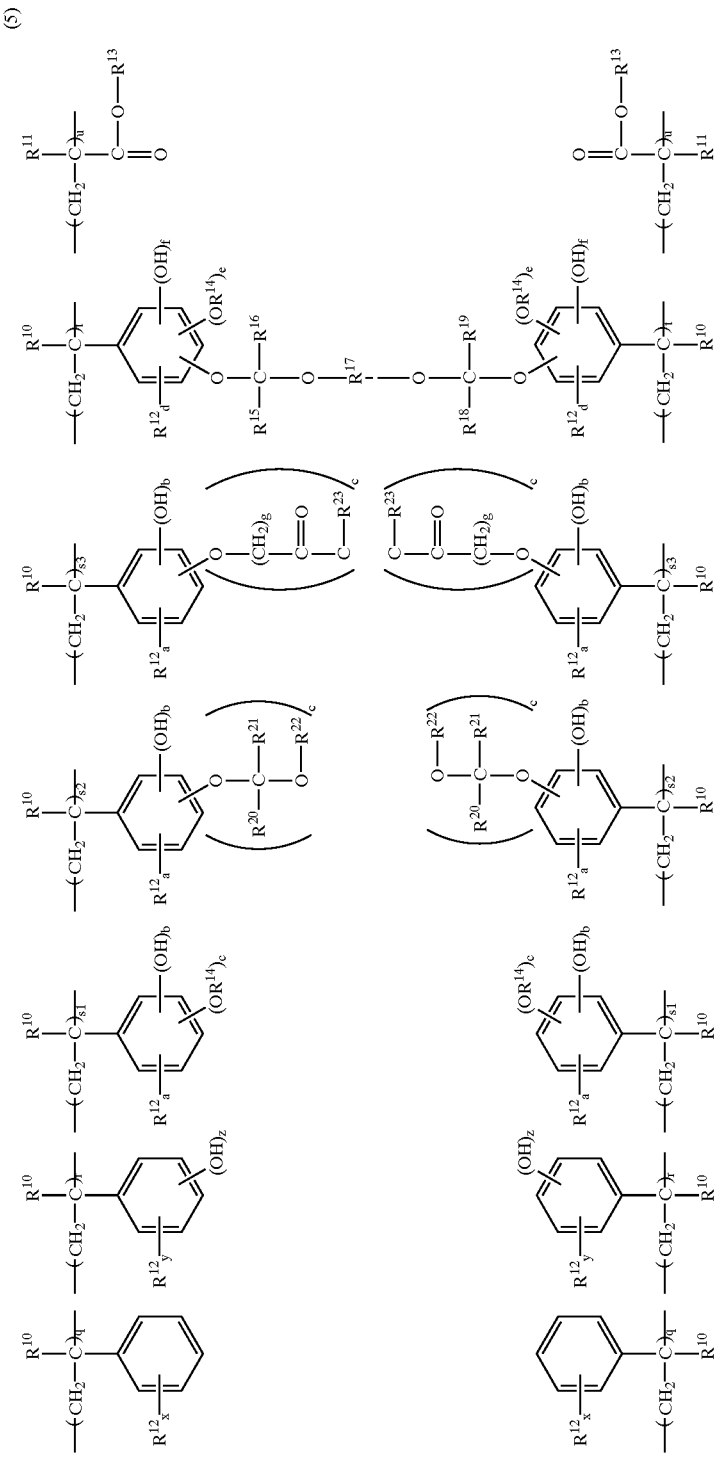

Herein

R$^{11}$, R$^{12}$, R$^{13}$, R$^{14}$, R$^{15}$, R$^{16}$, R$^{17}$, R$^{18}$, R$^{19}$, x, y, a, b, c, d, e, and f are as defined above, R$^{21}$ and R$^{22}$ are independently hydrogen or straight, branched or cyclic alkyl groups of 1 to 8 carbon atoms, R$^{23}$ is a monovalent hydrocarbon group of 1 to 18 carbon atoms which may have a hetero atom, a pair of R$^{21}$ and R$^{22}$, a pair of R$^{21}$ and R$^{23}$ or a pair of R$^{22}$ and R$^{23}$, taken together, may form a ring, each of R$^{21}$, R$^{22}$ and R$^{23}$ is a straight or branched alkylene group of 1 to 8 carbon atom when they form a ring, R$^{24}$ is a tertiary alkyl group of 4 to 20 carbon atoms, g is 0 or a positive integer of 1 to 6, q, s1, s2, s3, t and u are 0 or positive numbers, r is a positive number, satisfying 0≦q/(q+r+s1+s2+s3+t+u)≦0.8, 0≦s1/(q+r+s1+s2+s3+t+u)≦0.8, 0≦s2/(q+r+s1+s2+s3+t+u)≦0.8, 0≦s3/(q+r+s1+s2+s3+t+u)≦0.8, 0<(s1+s2+s3)/(q+r+s1+s2+s3+t+u)≦0.8, 0≦t/(q+r+s1+s2+s3+t+u)≦0.8, 0≦u/(q+r+s1+s2+s3+t+u)≦0.8, 0<(r+s1+s2+s3+t)/(q+r+s1+s2+s3+t+u)≦1, and 0<r/(q+r+s1+s2+s3+t+u)≦0.8.

In the preferred resist composition, component (C) is an onium salt and/or diazomethane derivative; and component (D) is an aliphatic amine.

In a third aspect, the invention provides a method for forming a contact hole pattern, comprising the steps of (i) applying the chemically amplified positive resist composition of any one of claims 1 to 9 onto a substrate to form a coating, (ii) heat treating the coating and exposing the coating to high energy radiation with a wavelength of up to 300 nm or electron beam through a photo-mask, (iii) optionally heat treating the exposed coating, and developing the coating with a developer, thereby forming a contact hole pattern, and (iv) further heat treating the contact hole pattern for reducing the size of contact holes.

DESCRIPTION OF THE PREFERRED EMBODIMENT

Figure 1:
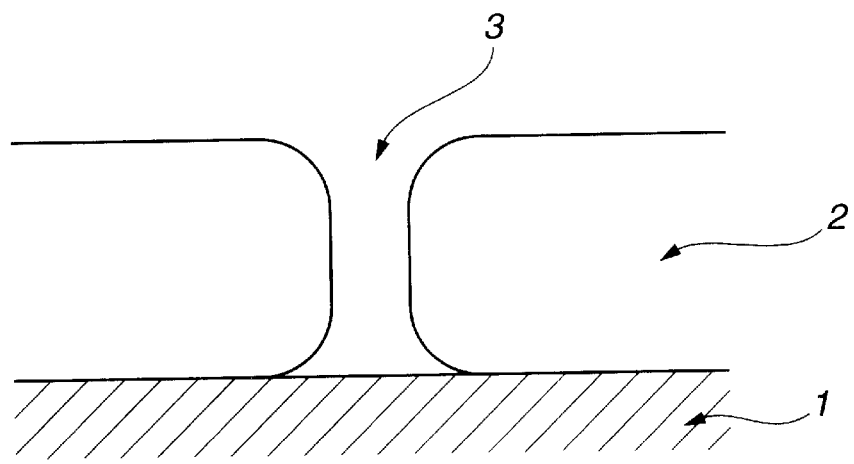
FIG. 1 illustrates in cross section a contact hole having bowed sidewalls after thermal flow.
Figure 2:
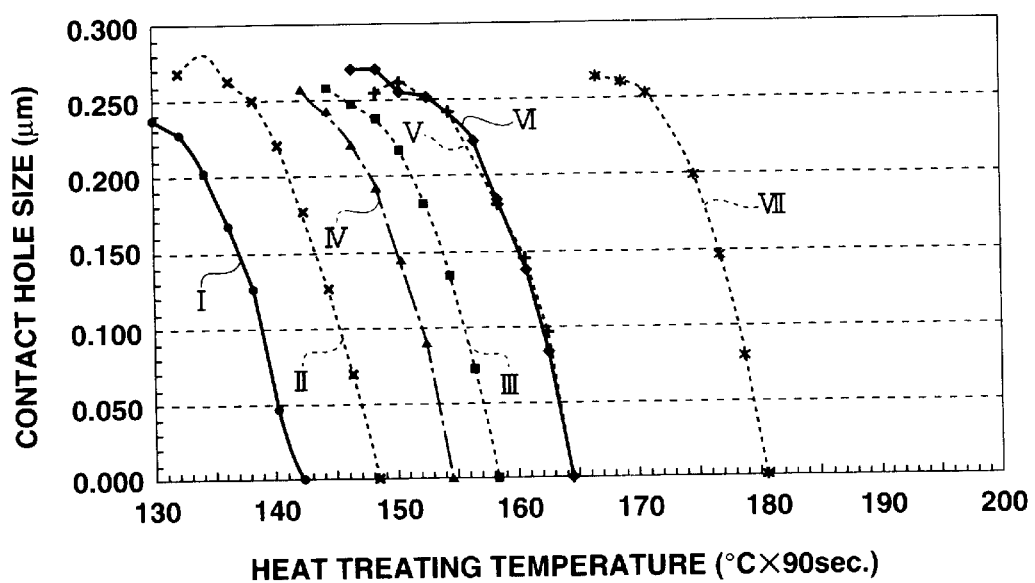
FIG. 2 is a graph showing a contact hole size versus a heating temperature in the thermal flow process.
Figure 3:
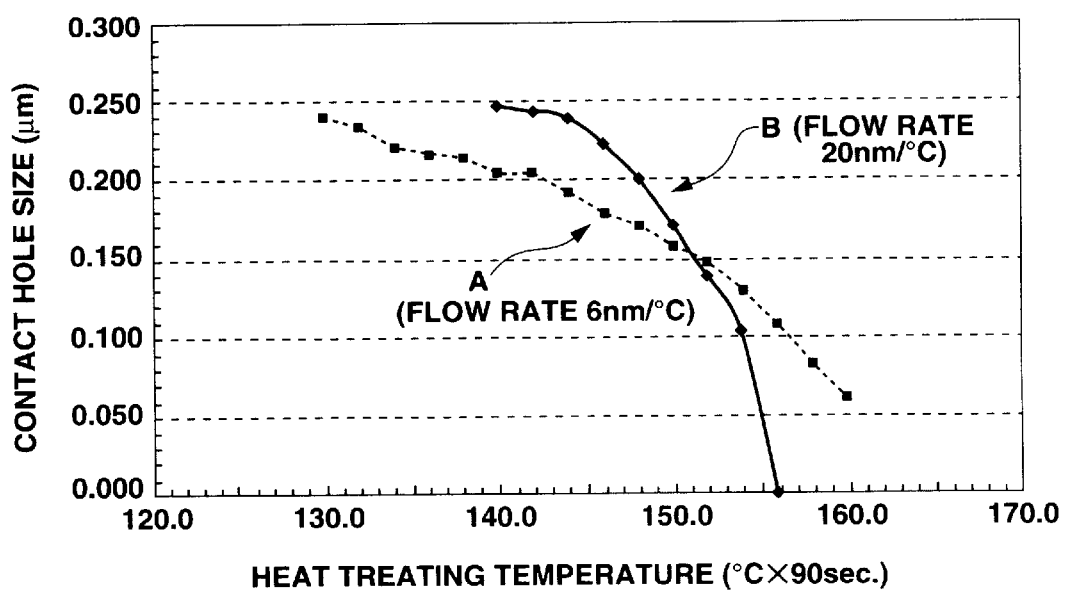
FIG. 3 is a graph showing the thermal flow rate of a resist composition having added thereto a compound having at least two functional groups and a control composition.

The chemical amplification type, positive working resist composition of the invention comprises a compound containing at least two functional groups of the following general formulas (1)-a to (1)-c in a molecule. A compound of the following general formula (2) is preferred.

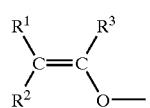
(1)-a

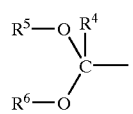
(1)-b

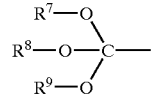
(1)-c

Herein R$^1$ to R$^4$ are independently hydrogen or straight, branched or cyclic alkyl groups of 1 to 12 carbon atoms, R$^5$ to R$^9$ are independently straight, branched or cyclic alkyl groups of 1 to 12 carbon atoms, and a pair of R$^1$ and R$^3$, a pair of R$^4$ and R$^5$, a pair of R$^5$ and R$^6$, a pair of R$^7$ and R$^8$, a pair of R$^7$ and R$^9$ or a pair of R$^8$ and R$^9$, taken together, may form a ring.

(2)

Herein Z is a functional group selected from the formulas (1)-a to (1)-c, the Z's may be the same or different, k is a positive integer of 2 to 6, and X is a k-valent organic group of 2 to 20 carbon atoms.

Examples of the alkenyloxy group represented by the general formula (1)-a:

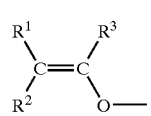
(1)-a include vinyloxy, propenyloxy, isopropenyloxy and groups of the following formulas.

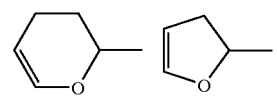

It is understood that the vinyloxy group is readily obtained by effecting addition reaction of acetylene to a compound having at least two alcohols in its structure (specifically reaction between alcohol and acetylene). The propenyloxy group is readily obtained by reacting an allyl halide with a compound having at least two alcohols in its structure (specifically reaction between alcohol and allyl halide), followed by transition and isomerization of the resulting allyloxy group under basic conditions.

Examples of the acetal group represented by the general formula (1)-b:

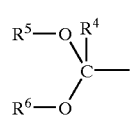
(1)-b are given below.

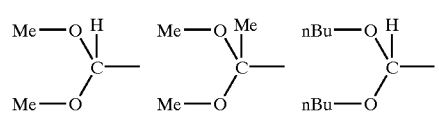

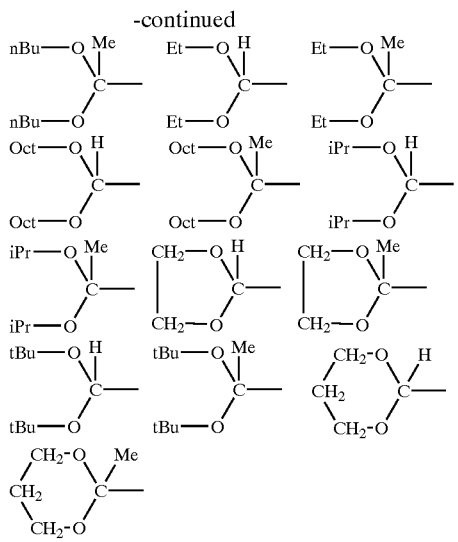

Herein Me is methyl, Et is ethyl, iPr is isopropyl, nBu is n-butyl, tBu is tert-butyl, and Oct is octyl.

The acetal group is readily obtained by reacting a compound having at least two aldehyde or ketone groups in its structure with an alcohol under acidic conditions (specifically reaction between aldehyde or ketone and alcohol).

Examples of the ortho-ester group represented by the general formula (1)-c:

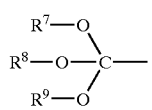 (1)-c are given below.

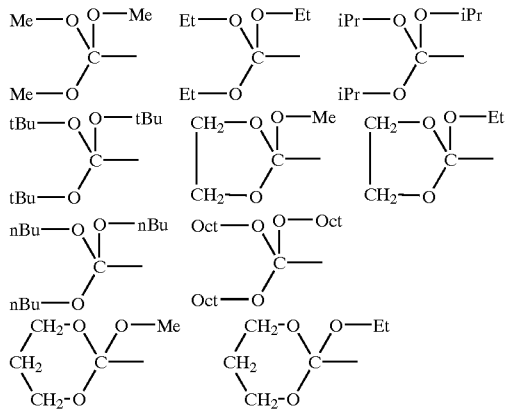

Herein Me is methyl, Et is ethyl, iPr is isopropyl, nBu is n-butyl, tBu is tert-butyl, and Oct is octyl.

The ortho-ester group is readily obtained by reacting a compound having at least two carboxylate groups in its structure with an alcohol under acidic conditions (specifically reaction between carboxylate and alcohol).

As described above, the structure of the compound containing functional groups of the formula (1) is represented by the formula (2).

 (2)

Herein X is a k-valent organic group of 2 to 20 carbon atoms. The letter k representative of the number of functional groups is a positive integer of 2 to 6.

More particularly, X is selected from substituted or unsubstituted, aliphatic, alicyclic or aromatic hydrocarbon groups of 2 to 20 carbon atoms, which may be separated by a hetero atom such as oxygen, and substituted ones of the foregoing hydrocarbon groups in which some or all of the hydrogen atoms are replaced by halogen atoms such as F, Cl and Br, hydroxyl groups, alkoxy groups, and the like. X has a valence corresponding to the number of Z groups. Where k=2, for example, X is a substituted or unsubstituted, straight, branched or cyclic alkylene group, arylene group, or aralkylene group, which may be separated by a hetero atom such as oxygen.

The structure of X is exemplified below.

Where the functional groups are alkenyloxy groups, the difunctional structure is exemplified by ethylene, propylene, isopropylene and the following formulas.

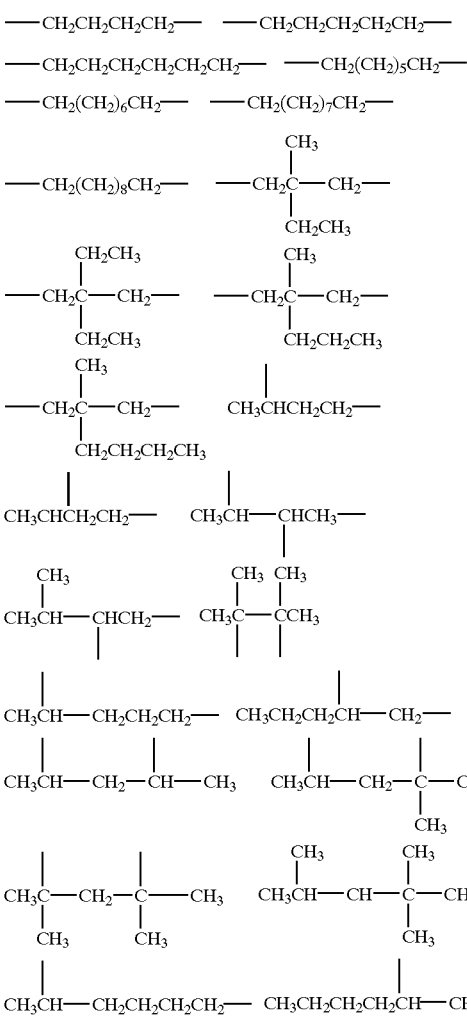

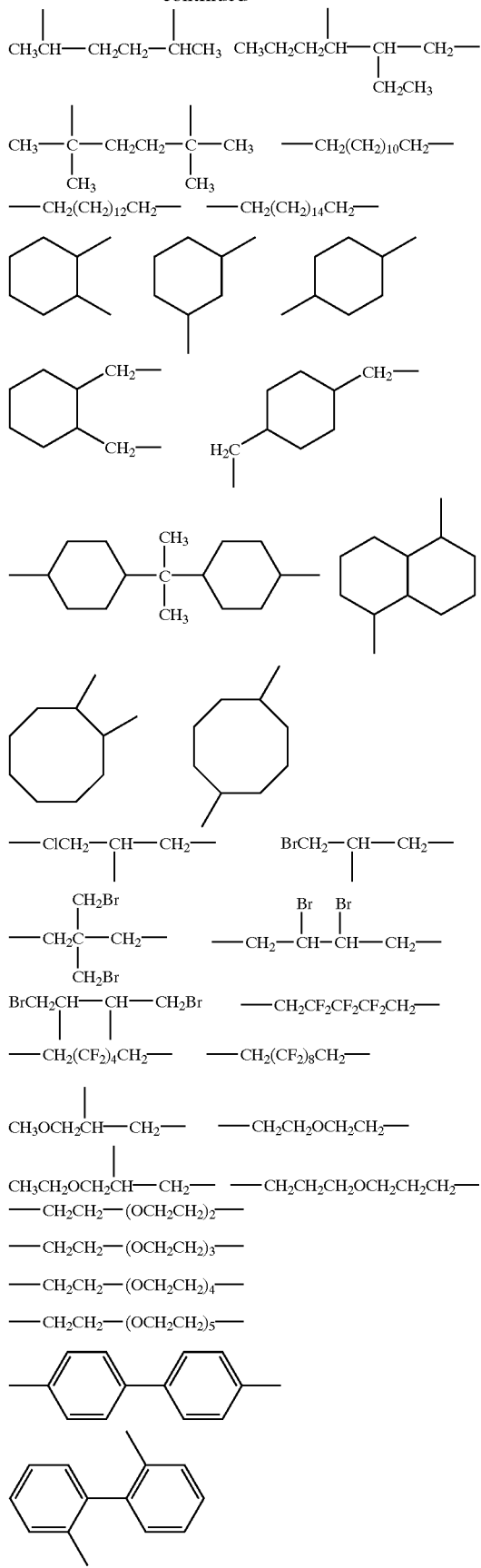
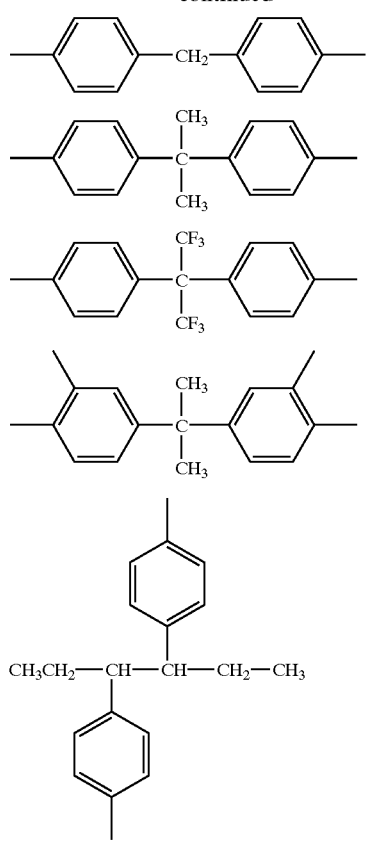
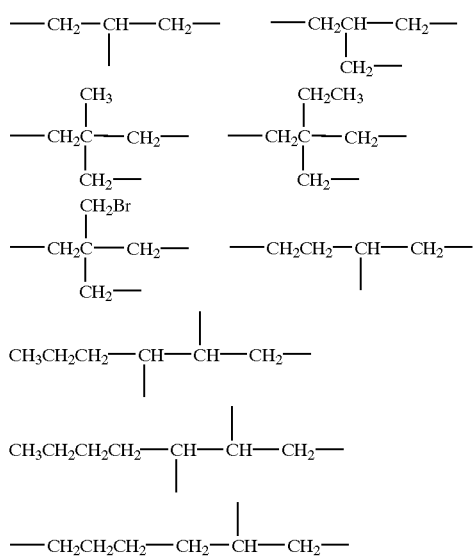
Where the functional groups are alkenyloxy groups, the trifunctional structure is exemplified by the following formulas.
Where the functional groups are alkenyloxy groups, the tetrafunctional structure is exemplified by the following formulas.

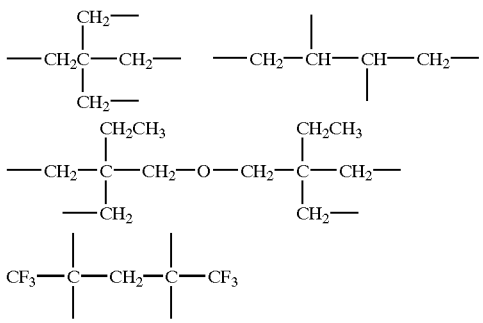

Where the functional groups are alkenyloxy groups, the hexafunctional structure is exemplified by the following formula.

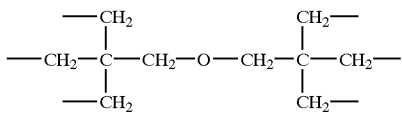

As described above, the vinyloxy group is readily obtained by effecting addition reaction of acetylene to a compound having at least two alcohols in its structure (specifically reaction between alcohol and acetylene). The propenyloxy group is readily obtained by reacting an allyl halide with a compound having at least two alcohols in its structure (specifically reaction between alcohol and allyl halide), followed by transition and isomerization of the resulting allyloxy group under basic conditions. Where the structure is trifunctional or more, all the alcohol groups may be reacted. There is a situation where two or more alcohols groups are reacted, but alcohol groups are left in the structure. The resulting structure is effective because thermal crosslinking reaction can take place.

In the case of tetra or more functionality, the polyhydric alcohols which can be used include the examples described below, and they may be reacted with acetylene or allyl halide to form a compound having two or more alkenyloxy groups. Useful polyhydric alcohols include threitol, adonitol, arabitol, xylitol, sorbitol, mannitol, iditol, dulcitol, fucose, ribose, arabinose, xylose, sorbose, mannose, galactose, glucose, and isomers thereof. All alcohol groups in the polyhydric alcohol compound may be substituted with alkenyloxy groups. Alternatively, two or more alcohol groups are substituted with alkenyloxy groups. It is also acceptable that some alcohol groups be substituted with other groups.

Where the functional groups are acetal groups, the structure represented by X is exemplified by ethylene, propylene, isopropylene and the following formulas.

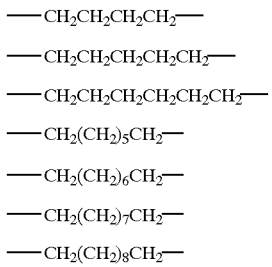

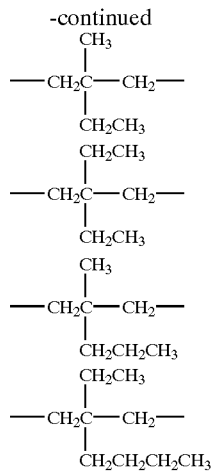

As described above, the acetal group is readily obtained by reacting an alcohol with a compound having at least two aldehyde or ketone groups in its structure under acidic conditions (specifically reaction between aldehyde or ketone and alcohol). Use may be made of compounds having at least two acetal groups which are synthesized by reacting compounds having aldehyde or ketone groups as shown below.

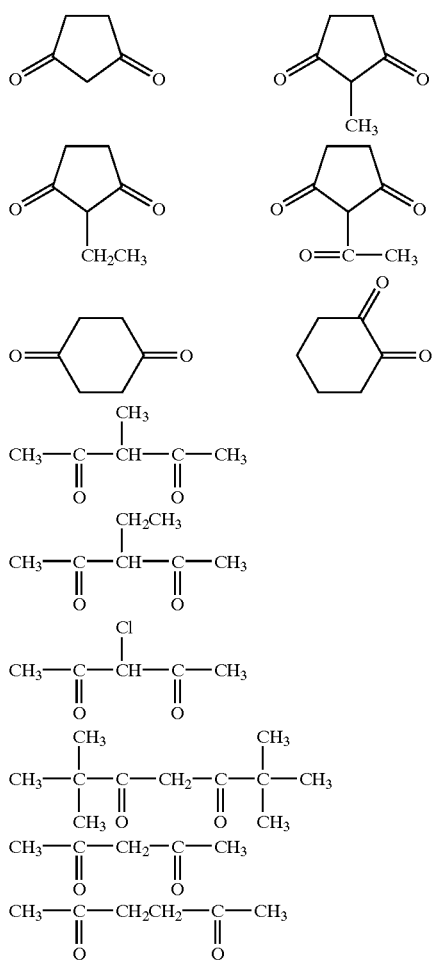

-continued

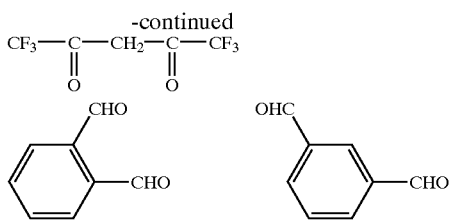

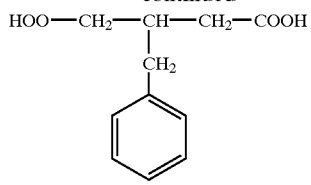

Where the functional groups are ortho-ester groups, the structure represented by X is exemplified by ethylene, propylene, isopropylene and the following formulas.

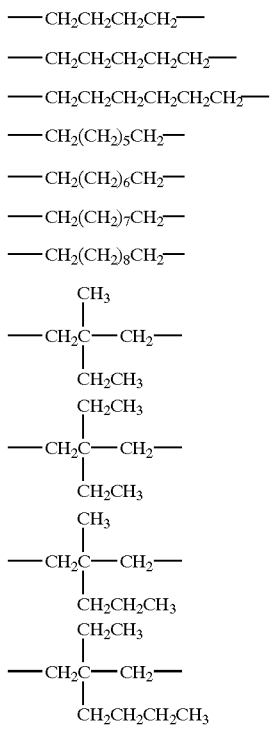

As described above, the ortho-ester group is readily obtained by reacting a compound having at least two carboxylate groups in its structure with an alcohol under acidic conditions (specifically reaction between carboxylate and alcohol). Use may be made of compounds having at least two ortho-ester groups which are synthesized by reacting alcohols with carboxylic ester derivatives as shown below.

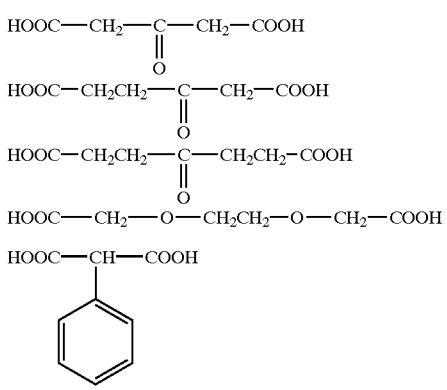

-continued

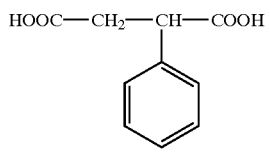

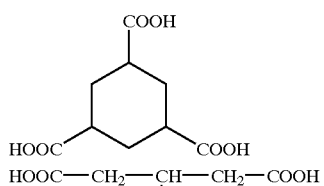

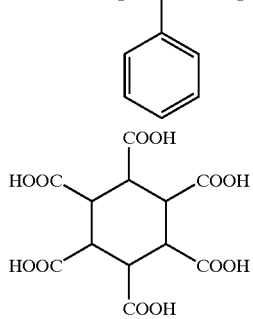

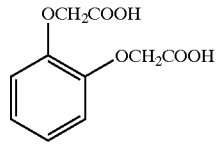

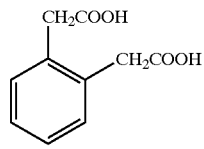 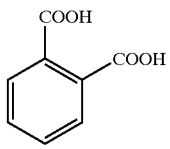

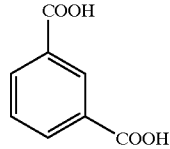 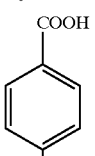

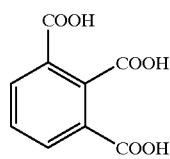 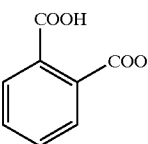

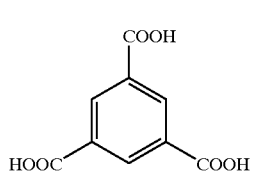 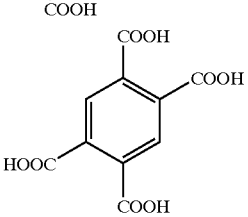

-continued

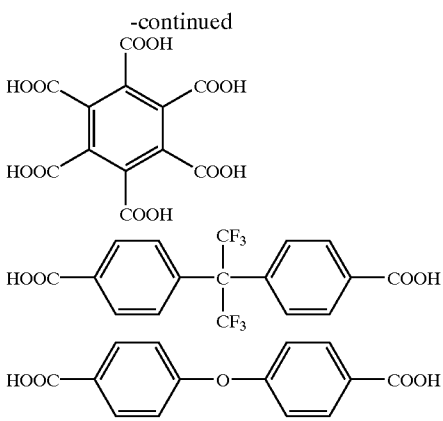

Where k in the general formula (2):

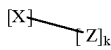 (2)

is a large number, substantial thermal crosslinking reaction takes place during heat treatment of the thermal flow process or during the baking step after coating of the resist composition, leaving a possibility that scum (or insoluble matter) be left on the resist pattern. Where k is a very small number, thermal crosslinking reaction takes place to a less than desired extent during the thermal flow process so that the flow rate may not be reduced. For this reason, k representative of the number of functional groups in formula (2) is preferably from 2 to 6, and especially from 3 to 4.

Since an aryl type hydrocarbon has a benzene ring or unsaturated cyclic structure, it absorbs deep UV used with chemically amplified positive resist compositions, typically KrF excimer laser light, leaving the risk of reducing the transmittance of the resist. With a lowering of the resist transmittance, the pattern configuration of contact holes can be exacerbated. For this reason, the structure represented by X favors a saturated hydrocarbon rather than the aryl type hydrocarbon.

Z represents a functional group of the general formula (1) and may be the same or a mixture of different functional groups.

The compound having at least two functional groups of the general formula (1) is preferably added to a chemically amplified positive resist composition in an amount of 0.1 to 5% by mass based on the entire resist composition. Outside the range, a less amount of the compound may be less effective for controlling the thermal flow rate whereas a larger amount of the compound may cause scum generation probably due to abnormal thermal crosslinking and adversely affect the resist sensitivity. A more appropriate amount is 0.5 to 2% by mass of the compound.

On use, the compound having at least two functional groups of the general formula (1) is added to a chemically amplified positive resist composition. Where the compound has a relatively low boiling point, there would arise a problem that if the resist coated on a substrate is held for some time prior to exposure, the compound in the resist coating will volatilize in that duration whereby the sensitivity of contact hole formation and the size of contact holes are altered. This problem is generally known as post coating delay and should be avoided in the device fabrication. For this reason, the compound should preferably have a relatively high boiling point so that it will not volatilize during the holding of the resist-coated substrate. Most preferably, the compound has a boiling point in excess of 200° C. under atmospheric pressure.

In addition to the compound having at least two functional groups of the general formula (1), the chemically amplified positive resist composition for forming a contact hole pattern according to the invention typically contains:

(A) an organic solvent,
(B) a base resin in the form of a polymer having acid labile groups,
(C) a photoacid generator, and
(D) a basic compound.

(A) Organic Solvent

The organic solvent used herein may be any organic solvent in which the base resin, photoacid generator, dissolution regulator, and other components are soluble. Illustrative, non-limiting, examples of the organic solvent include ketones such as cyclohexanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate. These solvents may be used alone or in combinations of two or more thereof. Of the above organic solvents, it is recommended to use diethylene glycol dimethyl ether, 1-ethoxy-2-propanol and ethyl lactate because the photoacid generator serving as one of the resist components is most soluble therein, propylene glycol monomethyl ether acetate because it is a safe solvent, or a mixture thereof.

An appropriate amount of the organic solvent used is about 200 to 1,000 parts, especially about 400 to 800 parts by mass per 100 parts by mass of the base resin.

(B) Base Resin

An appropriate base resin used herein is a resin which changes its solubility in an alkaline developer solution under the action of an acid. It is typically, though not limited thereto, an alkali-soluble resin having phenolic hydroxyl and/or carboxyl groups in which some or all of the phenolic hydroxyl and/or carboxyl groups are protected with acid-labile protective groups having C—O—C.

The alkali-soluble resins having phenolic hydroxyl and/or carboxyl groups include homopolymers and copolymers of p-hydroxystyrene, m-hydroxystyrene, α-methyl-p-hydroxystyrene, 4-hydroxy-2-methylstyrene, 4-hydroxy-3-methylstyrene, methacrylic acid and acrylic acid, and such copolymers having a carboxylic derivative or diphenyl ethylene introduced at their terminus.

Also included are copolymers in which units free of alkali-soluble sites such as styrene, α-methylstyrene, acrylate, methacrylate, hydrogenated hydroxystyrene, maleic anhydride and maleimide are introduced in addition to the above-described units in such a proportion that the solubility in an alkaline developer may not be extremely reduced. Substituents on the acrylates and methacrylates may be any of the substituents which do not undergo acidolysis. Exemplary substituents are straight, branched or cyclic $C_{1-8}$ alkyl groups and aromatic groups such as aryl groups, but not limited thereto.

Examples include poly(p-hydroxystyrene), poly(m-hydroxystyrene), poly(4-hydroxy-2-methylstyrene), poly(4-hydroxy-3-methylstyrene), poly(α-methyl-p-hydroxystyrene), partially hydrogenated p-hydroxystyrene copolymers, p-hydroxystyrene-α-methyl-p-hydroxystyrene copolymers, p-hydroxystyrene-α-methylstyrene copolymers, p-hydroxystyrene-styrene copolymers, p-hydroxystyrene-m-hydroxystyrene copolymers, p-hydroxystyrene-styrene copolymers, p-hydroxystyrene-acrylic acid copolymers, p-hydroxystyrene-methacrylic acid copolymers, p-hydroxystyrene-methyl methacrylate copolymers, p-hydroxystyrene-acrylic acid-methyl methacrylate copolymers, p-hydroxystyrene-methyl acrylate copolymers, p-hydroxystyrene-methacrylic acid-methyl methacrylate copolymers, poly(methacrylic acid), poly(acrylic acid), acrylic acid-methyl acrylate copolymers, methacrylic acid-methyl methacrylate copolymers, acrylic acid-maleimide copolymers, methacrylic acid-maleimide copolymers, p-hydroxystyrene-acrylic acid-maleimide copolymers, and p-hydroxystyrene-methacrylic acid-maleimide copolymers, but are not limited to these combinations.

Preferred are poly(p-hydroxystyrene), partially hydrogenated p-hydroxystyrene copolymers, p-hydroxystyrene-styrene copolymers, p-hydroxystyrene-acrylic acid copolymers, and p-hydroxystyrene-methacrylic acid copolymers.

The preferred base resin is an alkali-soluble resin comprising recurring units of the following general formula (3). The preferred base resin is a polymer comprising recurring units of the general formula (3) in which some of the hydrogen atoms of the phenolic hydroxyl groups are partially replaced by acid labile groups of at least one type, and/or some of the hydrogen atoms of the remaining phenolic hydroxyl groups are eliminated for crosslinkage within a molecule and/or between molecules with crosslinking groups having C—O—C linkages, the total of the acid labile groups and the crosslinking groups being more than 0 mol % to 80 mol % of the entire hydrogen atoms of phenolic hydroxyl groups in the formula (3). The polymer has a weight average molecular weight of 1,000 to 500,000,

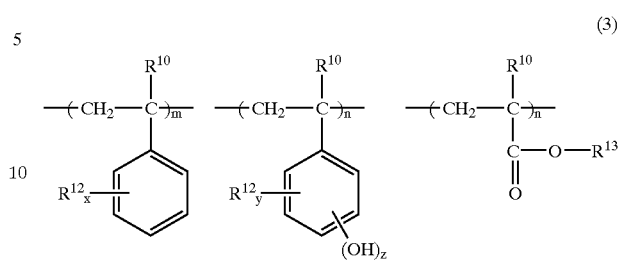

In formula (3), $R^{10}$ is hydrogen or methyl, $R^{11}$ is hydrogen or a methyl, phenyl or cyano group, $R^{12}$ is a straight, branched or cyclic alkyl group of 1 to 8 carbon atoms, $R^{13}$ is hydrogen or a straight, branched or cyclic alkyl group of 1 to 10 carbon atoms, x is 0 or a positive integer of up to 5, y and z are positive integers satisfying y+z≦5, m and p are 0 or positive numbers, n is a positive number, satisfying 0≦m/(m+n+p)≦0.8, 0<n/(m+n+p)≦1, and 0≦p/(m+n+p)≦0.8.

The polymer should have a weight average molecular weight (Mw) of 1,000 to 500,000, and especially 3,000 to 100,000. With a Mw of less than 1,000, polymers would perform poorly and often lack heat resistance and film formability. Polymers with a Mw of more than 500,000 would be less soluble in a developer and a resist solvent because of their too high molecular weight. Also the polymer should preferably have a dispersity (Mw/Mn) of up to 3.5, preferably up to 1.5. A dispersity of more than 3.5 often leads to poor resolution.

The preparation method is not critical although poly(p-hydroxystyrene) and similar polymers can be synthesized by living anion polymerization to a low or narrow dispersity.

More preferably, the base resin (B) is a polymer comprising recurring units of the formula (3), that is, a copolymer containing p-hydroxystyrene and/or α-methyl-p-hydroxystyrene and an acrylic acid and/or methacrylic acid in which some hydrogen atoms of phenolic hydroxyl groups are partially replaced by acid labile groups of at least one type, the acrylate and/or methacrylate is an ester protected with an acid labile group, the units of acrylate and methacrylate are contained in the polymer in a proportion of more than 0 mol % to 50 mol % on the average, and the acid labile groups are present in a proportion of more than 0 mol % to 80 mol %, on the average, based on the entire polymer.

This polymer is typically a polymer represented by the following general formula (4), that is a polymer comprising recurring units of the general formula (3) in which some of the hydrogen atoms of the phenolic hydroxyl groups are partially replaced by acid labile groups of at least one type, and/or some of the hydrogen atoms of the remaining phenolic hydroxyl groups are eliminated for crosslinkage within a molecule and/or between molecules with crosslinking groups having C—O—C linkages, the total of the acid labile groups and the crosslinking groups being more than 0 mol % to 80 mol % of the entire hydrogen atoms of phenolic hydroxyl groups in formula (3). The polymer has a weight average molecular weight of 1,000 to 500,000,

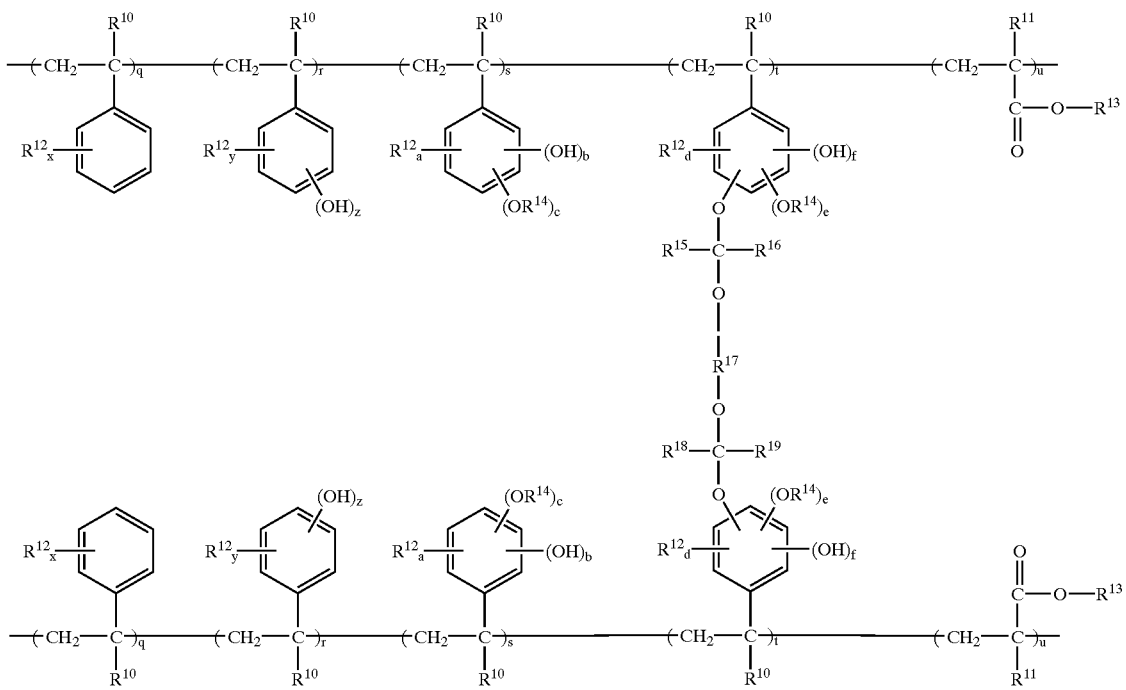
(4)

Herein $R^{10}$ is hydrogen or methyl, $R^{11}$ is hydrogen or a methyl, phenyl or cyano group, $R^{12}$ is a straight, branched or cyclic alkyl group of 1 to 8 carbon atoms, $R^{13}$ is hydrogen or a straight, branched or cyclic alkyl group of 1 to 10 carbon atoms, $R^{14}$ is an acid labile group of at least one type, $R^{15}$, $R^{16}$, $R^{18}$ and $R^{19}$ are independently hydrogen or straight, branched or cyclic alkyl groups of 1 to 6 carbon atoms, and $R^{17}$ is a divalent or polyvalent hydrocarbon group of 1 to 10 carbon atoms which may be separated by an oxygen atom, for example, a straight, branched or cyclic alkylene, alkylene ether, and arylene such as phenylene. Each unit may be constructed of one type or at least two types.

The letter x is 0 or a positive integer of up to 5, y and z are positive integers satisfying $y+z \leq 5$; a, b and c are positive integers satisfying $a+b+c \leq 5$, with the proviso that c is not equal to 0; d, e and f are 0 or positive integers satisfying $d+e+f \leq 4$; q, t and u are 0 or positive numbers, r and s are positive numbers, satisfying $0 \leq q/(q+r+s+t+u) \leq 0.8$, $0<s/(q+r+s+t+u) \leq 0.8$, $0 \leq t/(q+r+s+t+u) \leq 0.8$, $0 \leq u/(q+r+s+t+u) \leq 0.8$, $0<(r+s+t)/(q+r+s+t+u) \leq 1$, and $0<r/(q+r+s+t+u) \leq 0.8$.

Illustrative, non-limiting, examples of the straight, branched or cyclic alkyl groups of 1 to 8 carbon atoms represented by $R^{12}$ include methyl, ethyl, propyl, isopropyl, n-butyl, isobutyl, tert-butyl, cyclohexyl, and cyclopentyl.

With respect to the acid labile groups represented by $R^{14}$, where some phenolic hydroxyl groups on the alkali-soluble resin are protected with acid labile substituents having C—O—C linkages, the acid labile groups are selected from a variety of such groups. The preferred acid labile groups are groups of the following general formulae (6) to (9), tertiary alkyl group of 4 to 20 carbon atoms, preferably 4 to 15 carbon atoms, trialkylsilyl groups whose alkyl groups each have 1 to 6 carbon atoms, or oxoalkyl groups of 4 to 20 carbon atoms.

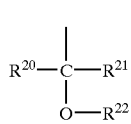
(6)

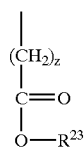
(7)

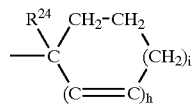
(8)

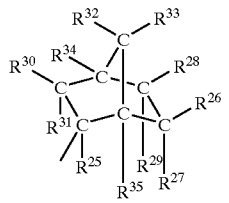
(9)

Herein $R^{20}$ and $R^{21}$ are independently hydrogen or straight, branched or cyclic alkyl groups of 1 to 18 carbon atoms, preferably 1 to 10 carbon atoms, for example, methyl, ethyl, propyl, isopropyl, n-butyl, sec-butyl, tert-butyl, cyclopentyl, cyclohexyl, 2-ethylhexyl and n-octyl. $R^{22}$ is a monovalent hydrocarbon group of 1 to 18 carbon atoms, preferably 1 to 10 carbon atoms, which may have a hetero atom (e.g., oxygen atom), for example, straight, branched or cyclic alkyl groups, and such groups in which some hydrogen atoms are replaced by hydroxyl, alkoxy, oxo, amino or alkylamino groups. Illustrative examples of the substituted alkyl groups are given below.

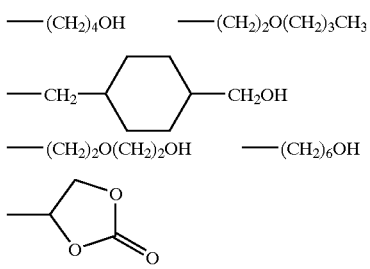

A pair of $R^{20}$ and $R^{21}$, a pair of $R^{20}$ and $R^{22}$, or a pair of $R^{21}$ and $R^{22}$, taken together, may form a ring. Each of $R^{20}$, $R^{21}$ and $R^{22}$ is a straight or branched alkylene group of 1 to 18 carbon atoms, preferably 1 to 10 carbon atoms, when they form a ring.

$R^{23}$ is a tertiary alkyl group of 4 to 20 carbon atoms, preferably 4 to 15 carbon atoms, a trialkylsilyl group whose alkyl groups each have 1 to 6 carbon atoms, an oxoalkyl group of 4 to 20 carbon atoms or a group of formula (6). Exemplary tertiary alkyl groups are tert-butyl, tert-amyl, 1,1-diethylpropyl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, and 2-methyl-2-adamantyl. Exemplary trialkylsilyl groups are trimethylsilyl, triethylsilyl, and dimethyl-tert-butylsilyl. Exemplary oxoalkyl groups are 3-oxocyclohexyl, 4-methyl-2-oxooxan-4-yl, and 5-methyl-5-oxooxoran-4-yl. Letter z is an integer of 0 to 6.

$R^{24}$ is a straight, branched or cyclic alkyl group of 1 to 8 carbon atoms or substituted or unsubstituted aryl group of 6 to 20 carbon atoms. Exemplary straight, branched or cyclic alkyl groups include methyl, ethyl, propyl, isopropyl, n-butyl, sec-butyl, tert-butyl, tert-amyl, n-pentyl, n-hexyl, cyclopentyl, cyclohexyl, cyclopentylmethyl, cyclopentylethyl, cyclohexylmethyl and cyclohexylethyl. Exemplary substituted or unsubstituted aryl groups include phenyl, methylphenyl, naphthyl, anthryl, phenanthryl, and pyrenyl. Letter h is equal to 0 or 1, i is equal to 0, 1, 2 or 3, satisfying 2h+i=2 or 3.

$R^{25}$ is a straight, branched or cyclic alkyl group of 1 to 8 carbon atoms or substituted or unsubstituted aryl group of 6 to 20 carbon atoms, examples of which are as exemplified for $R^{24}$. $R^{26}$ to $R^{35}$ are independently hydrogen or monovalent hydrocarbon groups of 1 to 15 carbon atoms which may contain a hetero atom, for example, straight, branched or cyclic alkyl groups such as methyl, ethyl, propyl, isopropyl, n-butyl, sec-butyl, tert-butyl, tert-amyl, n-pentyl, n-hexyl, n-octyl, n-nonyl, n-decyl, cyclopentyl, cyclohexyl, cyclopentylmethyl, cyclopentylethyl, cyclopentylbutyl, cyclohexylmethyl, cyclohexylethyl, and cyclohexylbutyl, and substituted ones of these groups in which some hydrogen atoms are replaced by hydroxyl, alkoxy, carboxy, alkoxycarbonyl, oxo, amino, alkylamino, cyano, mercapto, alkylthio, and sulfo groups. $R^{26}$ to $R^{35}$, for example, a pair of $R^{26}$ and $R^{27}$, a pair of $R^{26}$ and $R^{28}$, a pair of $R^{27}$ and $R^{29}$, a pair of $R^{28}$ and $R^{29}$, a pair of $R^{30}$ and $R^{31}$, or a pair of $R^{32}$ and $R^{33}$, taken together, may form a ring. When $R^{26}$ to $R^{36}$ form a ring, they are divalent $C_1$–$C_{15}$ hydrocarbon groups which may contain a hetero atom, examples of which are the above-exemplified monovalent hydrocarbon groups with one hydrogen atom eliminated. Also, two of $R^{26}$ to $R^{35}$ which are attached to adjacent carbon atoms (for example, a pair of $R^{26}$ and $R^{28}$, a pair of $R^{28}$ and $R^{34}$, or a pair of $R^{32}$ and $R^{34}$) may directly bond together to form a double bond.

Of the acid labile groups of formula (6), illustrative examples of the straight or branched groups are given below.

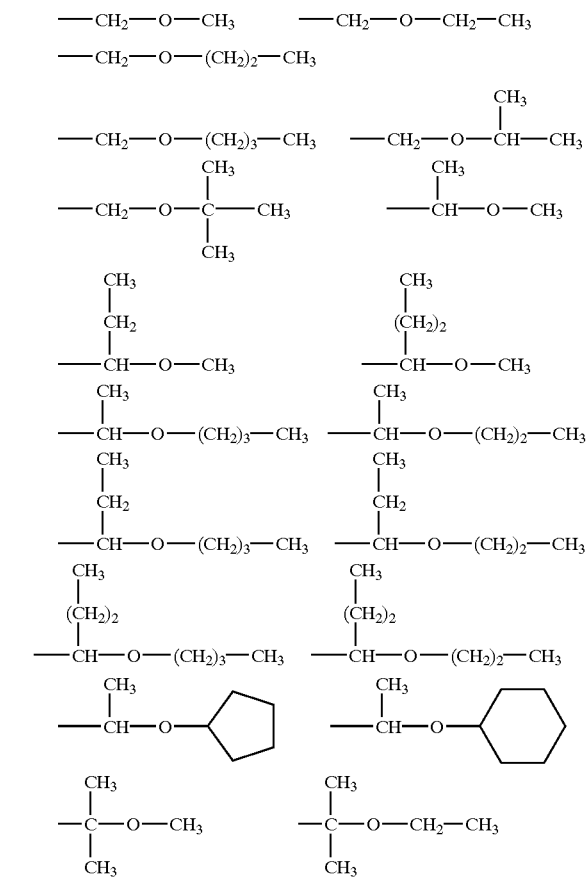

Of the acid labile groups of formula (6), illustrative examples of the cyclic groups include tetrahydrofuran-2-yl, 2-methyltetrahydrofuran-2-yl, tetrahydropyran-2-yl and 2-methyltetrahydropyran-2-yl.

Illustrative examples of the acid labile groups of formula (7) include tert-butoxycarbonyl, tert-butoxycarbonylmethyl, tert-amyloxycarbonyl, tert-amyloxycarbonylmethyl, 1,1-diethylpropyloxycarbonyl, 1,1-diethylpropyloxycarbonylmethyl, 1-ethylcyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrolofuranyloxycarbonylmethyl.

Illustrative examples of the acid labile groups of formula (8) include 1-methylcyclopentyl, 1-ethylcyclopentyl, 1-n-propylcyclopentyl, 1-isopropylcyclopentyl, 1-n-butylcyclopentyl, 1-sec-butylcyclopentyl, 1-methylcyclohexyl, 1-ethylcyclohexyl, 3-methyl-1-cyclopenten-3-yl, 3-ethyl-1-cyclopenten-3-yl, 3-methyl-1-cyclohexen-3-yl, and 3-ethyl-1-cyclohexen-3-yl.

Illustrative examples of the acid labile groups of formula (9) are given below.

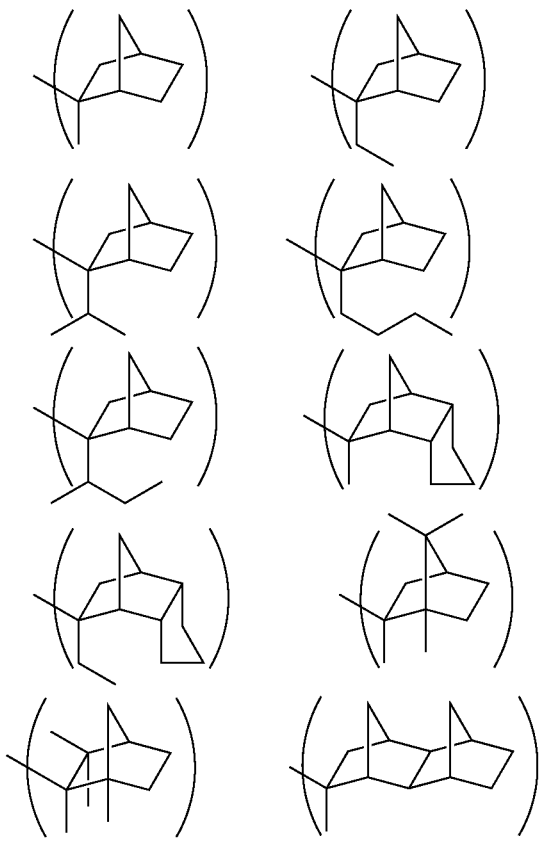

Exemplary of the tertiary alkyl group of 4 to 20 carbon atoms, preferably 4 to 15 carbon atoms, are tert-butyl, tert-amyl, 3-ethyl-3-pentyl and dimethylbenzyl.

Exemplary of the trialkylsilyl groups whose alkyl groups each have 1 to 6 carbon atoms are trimethylsilyl, triethylsilyl, and tert-butyldimethylsilyl.

Exemplary of the oxoalkyl groups of 4 to 20 carbon atoms are 3-oxocyclohexyl and groups represented by the following formulae.

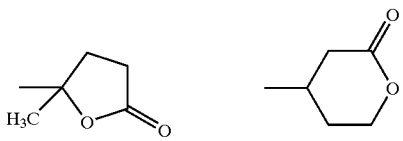

Also the base resin (B) may be a polymer comprising units of formula (3) in which some of the hydrogen atoms of the phenolic hydroxyl groups are partially replaced by acid labile groups of one or more types, and the hydrogen atoms of the remaining phenolic hydroxyl groups are crosslinked within a molecule and/or between molecules, in a proportion of more than 0 mol % to 80 mol %, on the average, of the entire phenolic hydroxyl groups on the polymer of formula (3), with crosslinking groups having C—O—C linkages represented by the following general formula (10).

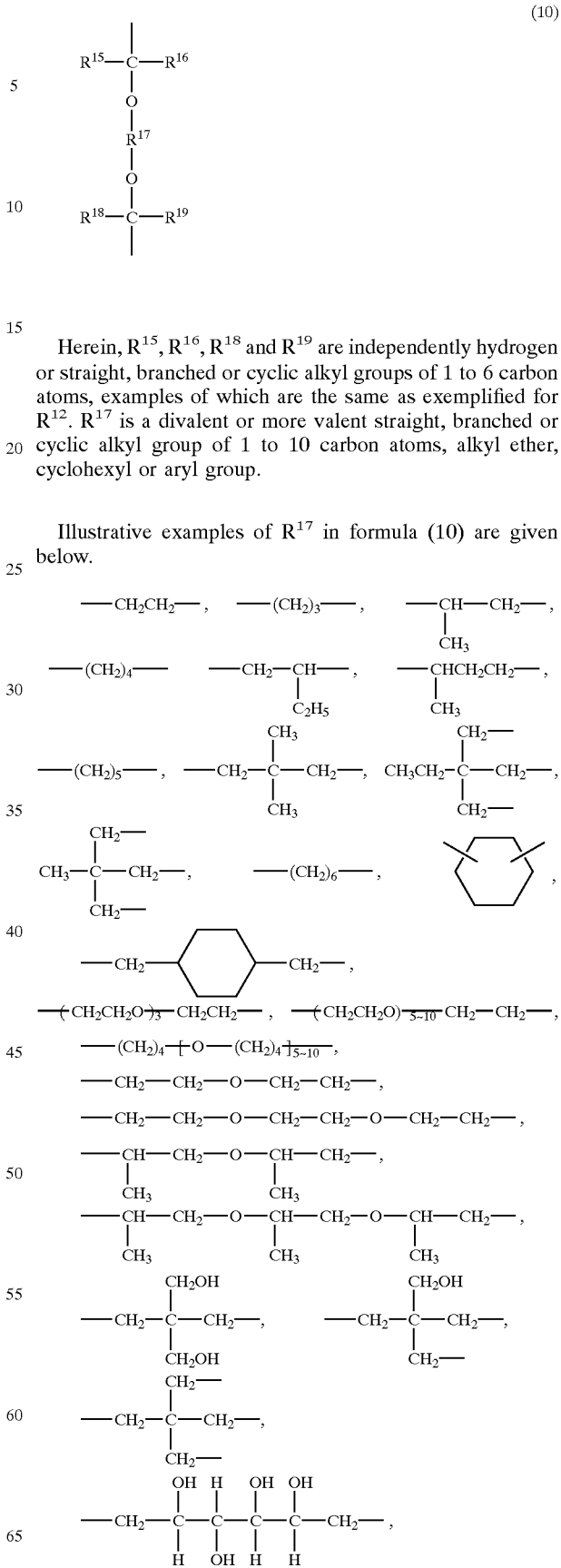

Herein, $R^{15}$, $R^{16}$, $R^{18}$ and $R^{19}$ are independently hydrogen or straight, branched or cyclic alkyl groups of 1 to 6 carbon atoms, examples of which are the same as exemplified for $R^{12}$. $R^{17}$ is a divalent or more valent straight, branched or cyclic alkyl group of 1 to 10 carbon atoms, alkyl ether, cyclohexyl or aryl group.

Illustrative examples of $R^{17}$ in formula (10) are given below.

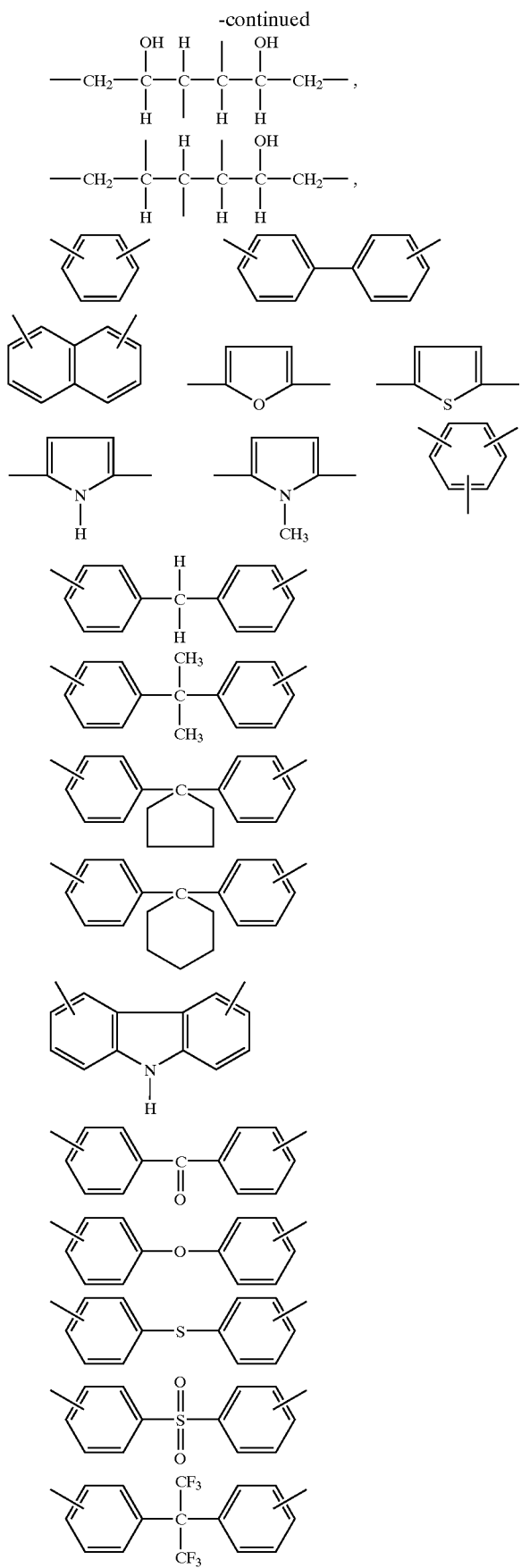
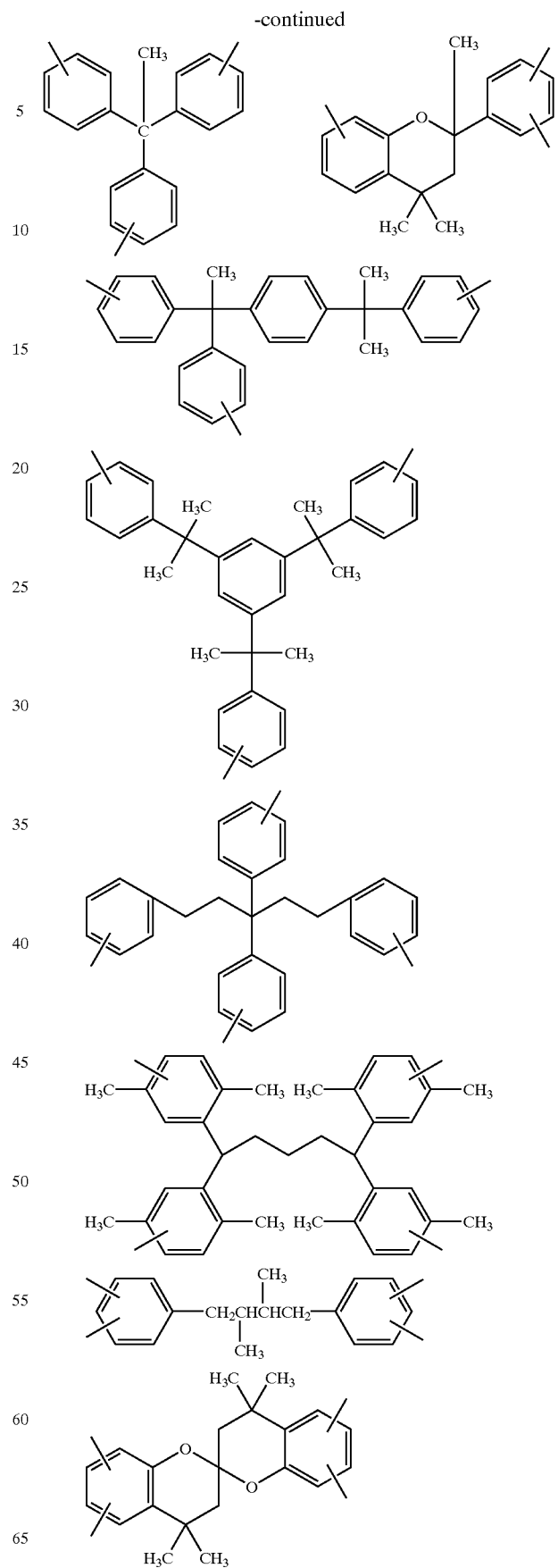

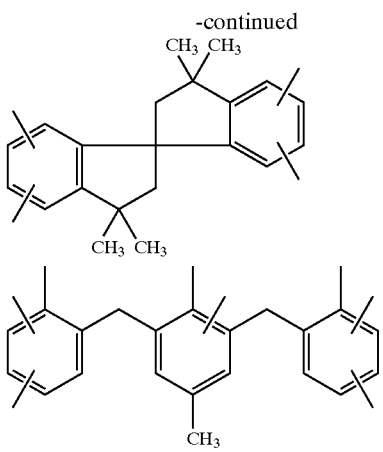

These crosslinking groups having C—O—C linkages within and/or between molecules are readily obtainable by reacting phenolic hydroxyl groups with alkenyl ether compounds or halogenated alkyl ether compounds.

Where the base resin in the resist composition according to the invention is crosslinked with acid labile substituents, it is a polymer which is obtained by reacting phenolic hydroxyl groups with an alkenyl ether compound or halogenated alkyl ether such that the polymer is crosslinked within a molecular and/or between molecules with crosslinking groups having C—O—C linkages, wherein the total amount of the acid labile groups and crosslinking groups is preferably, on the average, more than 0 mol % to 80 mol %, especially 2 to 50 mol %, based on the entire phenolic hydroxyl groups in formula (3).

An appropriate proportion of crosslinking groups having C—O—C linkages is, on the average, from more than 0 mol % to 50 mol %, and especially from 0.2 to 20 mol %. With 0 mol %, few benefits of the crosslinking group are obtained, resulting in a reduced contrast of alkali dissolution rate and a low resolution. With more than 50 mol %, a too much crosslinked polymer would gel, become insoluble in alkali, induce a film thickness change, internal stresses or bubbles upon alkali development, and lose adhesion to the substrate due to less hydrophilic groups.

The proportion of acid labile groups is on the average preferably from more than 0 mol % to 80 mol %, especially from 10 to 50 mol %. With 0 mol %, there may result a reduced contrast of alkali dissolution rate and a low resolution. With more than 80 mol %, there may result a loss of alkali dissolution, less affinity to an alkali developer upon development, and a low resolution.

By properly selecting the proportions of crosslinking groups having C—O—C linkages and acid labile groups within the above-defined ranges, it becomes possible to control the size and configuration of a resist pattern as desired. The contents of crosslinking groups having C—O—C linkages and acid labile groups in the polymer have substantial influence on the dissolution rate contrast of a resist film and govern the properties of the resist composition relating to the size and configuration of a resist pattern.

In the resist composition, the preferred acid labile groups introduced in the base resin (B) are 1-ethoxycyclopentyl, 1-ethoxycyclohexylcarbonylmethyl, tert-amyl, 1-ethoxyethyl, 1-ethoxypropyl, tetrahydrofuranyl, tetrahydropyranyl, tert-butyl, 1-ethylcyclohexyl, tert-butoxycarbonyl, tert-butoxycarbonylmethyl groups, and substituents of formula (10) wherein $R^{15}$ and $R^{18}$ are methyl, $R^{16}$ and $R^{19}$ are hydrogen, and $R^{17}$ is ethylene, 1,4-butylene or 1,4-cyclohexylene.

In a single polymer, these substituents may be incorporated alone or in admixture of two or more types. A blend of two or more polymers having substituents of different types is also acceptable.

Appropriate combinations of substituents of two or more types include a combination of acetal with acetal analog, a combination of acetal with a substituent having a different degree of scission by acid such as tert-butoxy, a combination of a crosslinking acid labile group with acetal, and a combination of a crosslinking acid labile group with a substituent having a different degree of scission by acid such as tert-butoxy.

The percent proportion of these substituents substituting for phenol and carboxyl groups in the polymer is not critical. Preferably the percent substitution is selected such that when a resist composition comprising the polymer is applied onto a substrate to form a coating, the unexposed area of the coating may have a dissolution rate of 0.01 to 10 Å/sec in a 2.38% tetramethylammonium hydroxide (TMAH) developer.

On use of a polymer containing a greater proportion of carboxyl groups which can reduce the alkali dissolution rate, the percent substitution must be increased or non-acid-labile substituents to be described later must be introduced.

When acid labile groups for intramolecular and/or intermolecular crosslinking are to be introduced, the percent proportion of crosslinking substituents is preferably up to 20 mol %, more preferably up to 10 mol %. If the percent substitution of crosslinking substituents is too high, crosslinking results in a higher molecular weight which can adversely affect dissolution, stability and resolution. It is also preferred to further introduce another non-crosslinking acid labile group into the crosslinked polymer at a percent substitution of up to 10 mol % for adjusting the dissolution rate to fall within the above range.

In the case of poly(p-hydroxystyrene), the optimum percent substitution differs between a substituent having a strong dissolution inhibitory action such as a tert-butoxycarbonyl group and a substituent having a weak dissolution inhibitory action such as an acetal group although the overall percent substitution is preferably 10 to 40 mol %, more preferably 20 to 30 mol %.

Polymers having such acid labile groups introduced therein should preferably have a weight average molecular weight (Mw) of 1,000 to 500,000. With a Mw of less than 1,000, polymers would perform poorly and often lack heat resistance and film formability. Polymers with a Mw of more than 500,000 would be less soluble in a developer and a resist solvent.

Where non-crosslinking acid labile groups are introduced, the polymer should preferably have a dispersity (Mw/Mn) of up to 3.5, preferably up to 1.5. A polymer with a dispersity of more than 3.5 often results in a low resolution. Where crosslinking acid labile groups are introduced, the starting alkali-soluble resin should preferably have a dispersity (Mw/Mn) of up to 1.5, and the dispersity is preferably kept at 3 or lower even after protection with crosslinking acid labile groups. If the dispersity is higher than 3, dissolution, coating, storage stability and/or resolution is often poor.

To impart a certain function, suitable substituent groups may be introduced into some of the phenolic hydroxyl and carboxyl groups on the acid labile group-protected polymer. Exemplary are substituent groups for improving adhesion to the substrate, non-acid-labile groups for adjusting dissolution in an alkali developer, and substituent groups for improving etching resistance. Illustrative, non-limiting, substituent groups include 2-hydroxyethyl, 2-hydroxypropyl, methoxymethyl, methoxycarbonyl, ethoxycarbonyl, methoxycarbonylmethyl, ethoxycarbonylmethyl, 4-methyl-2-oxo-4-oxoranyl, 4-methyl-2-oxo-4-oxanyl, methyl, ethyl, propyl, n-butyl, sec-butyl, acetyl, pivaloyl, adamantyl, isobornyl, and cyclohexyl.

In a further illustrative and preferred embodiment, the base resin (B) is a polymer represented by the following general formula (5), that is a polymer comprising recurring units of the general formula (3) in which some of the hydrogen atoms of the phenolic hydroxyl groups are partially replaced by acid labile groups of at least one type, and/or some of the hydrogen atoms of the remaining phenolic hydroxyl groups are eliminated for crosslinkage within a molecule and/or between molecules with crosslinking groups having C—O—C linkages, the total of the acid labile groups and the crosslinking groups being more than 0 mol % to 80 mol % of the entire hydrogen atoms of phenolic hydroxyl groups in formula (3). The polymer has a weight average molecular weight of 1,000 to 500,000.

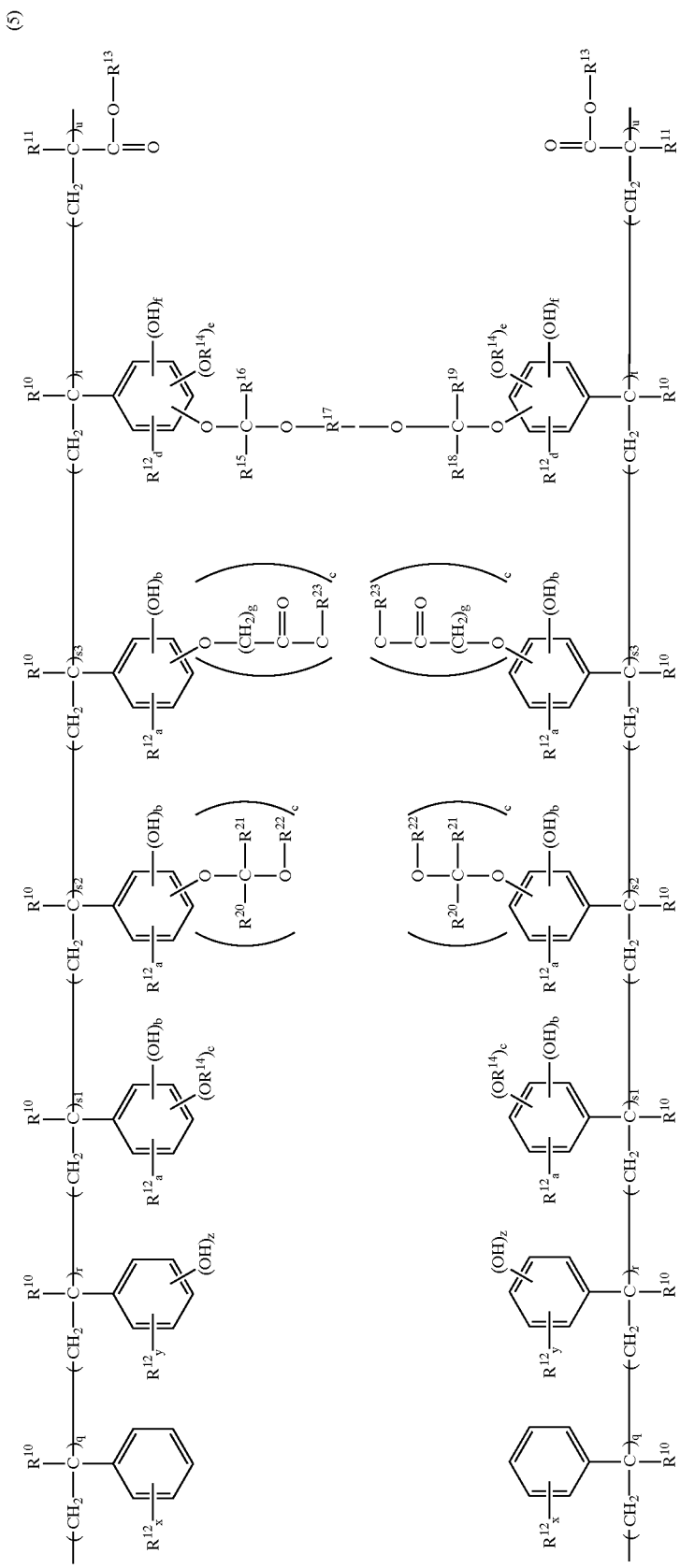

Herein $R^{11}$, $R^{12}$, $R^{13}$, $R^{14}$, $R^{15}$, $R^{16}$, $R^{17}$, $R^{18}$, $R^{19}$, x, y, z, a, b, c, d, e, and f are as defined above.

$R^{21}$ and $R^{22}$ are independently hydrogen or straight, branched or cyclic alkyl groups of 1 to 8 carbon atoms, $R^{23}$ is a monovalent hydrocarbon group of 1 to 18 carbon atoms which may have a hetero atom, a pair of $R^{21}$ and $R^{22}$, a pair of $R^{21}$ and $R^{23}$ or a pair of $R^{22}$ and $R^{23}$, taken together, may form a ring, each of $R^{21}$, $R^{22}$ and $R^{23}$ is a straight or branched alkylene group of 1 to 8 carbon atom when they form a ring, and $R^{24}$ is a tertiary alkyl group of 4 to 20 carbon atoms.

The letter g is 0 or a positive integer of 1 to 6, q, s1, s2, s3, t and u are 0 or positive numbers, r is a positive number, satisfying $$0 \leq q/(q+r+s1+s2+s3+t+u) \leq 0.8,$$

$$0 \leq s1/(q+r+s1+s2+s3+t+u) \leq 0.8,$$

$$0 \leq s2/(q+r+s1+s2+s3+t+u) \leq 0.8,$$

$$0 \leq s3/(q+r+s1+s2+s3+t+u) \leq 0.8,$$

$$0 < (s1+s2+s3)/(q+r+s1+s2+s3+t+u) \leq 0.8,$$

$$0 \leq t/(q+r+s1+s2+s3+t+u) \leq 0.8,$$

$$0 \leq u/(q+r+s1+s2+s3+t+u) \leq 0.8,$$

$$0 < (r+s1+s2+s3+t)/(q+r+s1+s2+s3+t+u) \leq 1,$$

and $$0 < r/(q+r+s1+s2+s3+t+u) \leq 0.8.$$

(C) Photoacid Generator

Illustrative examples of the photoacid generator include:

onium salts such as diphenyliodonium trifluoromethanesulfonate, (p-tert-butoxyphenyl) phenyliodonium trifluoromethanesulfonate, diphenyliodonium p-toluenesulfonate, (p-tert-butoxyphenyl) phenyliodonium p-toluenesulfonate, triphenylsulfonium trifluoromethanesulfonate, (p-tert-butoxyphenyl)diphenylsulfonium trifluoromethanesulfonate, bis(p-tert-butoxyphenyl) phenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, bis(p-tert-butoxyphenyl)phenylsulfonium p-toluenesulfonate, tris(p-tert-butoxyphenyl) sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl)sulfonium trifluoromethanesulfonate, cyclohexylmethyl(2-oxocyclohexyl)sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate, and dicyclohexylphenylsulfonium p-toluenesulfonate;

β-ketosulfone derivatives such as 2-cyclohexylcarbonyl-2-(p-toluenesulfonyl)propane and 2-isopropylcarbonyl-2-(p-toluenesulfonyl)propane;

diazomethane derivatives such as bis(benzenesulfonyl) diazomethane, bis(p-toluenesulfonyl)diazomethane, bis(cyclohexylsulfonyl)diazomethane, bis(n-butylsulfonyl)diazomethane, bis(isobutylsulfonyl) diazomethane, bis(secbutylsulfonyl)diazomethane, bis (n-propylsulfonyl)diazomethane, bis (isopropylsulfonyl)diazomethane, and bis(tert-butylsulfonyl)diazomethane;

disulfone derivatives such as diphenyl disulfone and dicyclohexyl disulfone;

nitrobenzyl sulfonate derivatives such as 2,6-dinitrobenzyl p-toluenesulfonate and 2,4-dinitrobenzyl p-toluenesulfonate;

sulfonic acid ester derivatives such as 1,2,3-tris (methanesulfonyloxy)benzene, 1,2,3-tris (trifluoromethanesulfonyloxy)benzene, and 1,2,3-tris (p-toluenesulfonyloxy)benzene; and imidoyl sulfonate derivatives such as phthalimidoyl triflate, phthalimidoyl tosylate, 5-norbornene-2,3-dicarboxyimidoyl triflate, 5norbornene-2,3-dicarboxyimidoyl tosylate, and 5norbornene-2,3-dicarboxyimidoyl n-butylsulfonate.

Preferred among these photoacid generators are onium salts such as triphenylsulfonium trifluoromethanesulfonate, (p-tert-butoxyphenyl)diphenylsulfonium trifluoromethanesulfonate, tris(p-tert-butoxyphenyl) sulfonium trifluoromethanesulfonate, triphenylsulfonium p-toluenesulfonate, (p-tert-butoxyphenyl) diphenylsulfonium p-toluenesulfonate, and tris(p-tert-butoxyphenyl)sulfonium p-toluenesulfonate; and diazomethane derivatives such as bis(benzenesulfonyl) diazomethane, bis(p-toluenesulfonyl)diazomethane, bis (cyclohexylsulfonyl)diazomethane, bis(n-butylsulfonyl) diazomethane, bis(isobutylsulfonyl)diazomethane, bis (secbutylsulfonyl)diazomethane, bis(n-propylsulfonyl) diazomethane, bis(isopropylsulfonyl)diazomethane, and bis (tert-butylsulfonyl)diazomethane. These photoacid generators may be used singly or in combinations of two or more thereof. Onium salts are effective for improving rectangularity, while diazomethane derivatives are effective for reducing standing waves. The combination of an onium salt with a diazomethane allows for fine adjustment of the profile.

The photoacid generator is preferably added in an amount of about 0.5 to 15 parts by mass, and especially about 1 to 8 parts by mass, per 100 parts by mass of all the base resins. At less than 0.5 part, the sensitivity would be poor. The addition of more than 15 parts would lower the alkali dissolution rate, resulting in a poor resolution, and the resist becomes less heat resistant because of an increased content of monomer components.

(D) Basic Compound

Examples of basic compounds include primary, secondary, and tertiary aliphatic amines, mixed amines, aromatic amines, heterocyclic amines, carboxyl group-bearing nitrogenous compounds, sulfonyl group-bearing nitrogenous compounds, hydroxyl group-bearing nitrogenous compounds, hydroxyphenyl group-bearing nitrogenous compounds, alcoholic nitrogenous compounds, amide derivatives, and imide derivatives, with the aliphatic amines being preferred.

Examples of suitable primary aliphatic amines include ammonia, methylamine, ethylamine, n-propylamine, isopropylamine, n-butylamine, iso-butylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, di-iso-propylamine, di-n-butylamine, di-iso-butylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, tri-iso-propylamine, tri-n-butylamine, tri-iso-butylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine. Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tertbutylpyridine, diphenylpyridine, benzylpyridine, methoxypyridine, butoxypyridine, dimethoxypyridine, 1-methyl-2-pyridone, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable carboxyl group-bearing nitrogenous compounds include aminobenzoic acid, indolecarboxylic acid, and amino acid derivatives (e.g. nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable sulfonyl group-bearing nitrogenous compounds include 3-pyridinesulfonic acid and pyridinium p-toluenesulfonate. Examples of suitable hydroxyl group-bearing nitrogenous compounds, hydroxyphenyl group-bearing nitrogenous compounds, and alcoholic nitrogenous compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, truisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]-piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of suitable amide derivatives include formamide, N-methylformamide, N,N-dimethylformamide, acetamide, N-methylacetamide, N,N-dimethylacetamide, propionamide, and benzamide. Suitable imide derivatives include phthalimide, succinimide, and maleimide. Of these, triethylamine, N,N-dimethylaniline, N-methylpyrrolidone, pyridine, quinoline, nicotinic acid, triethanolamine, piperidine ethanol, N,N-dimethylacetamide and succinimide are preferred.

The basic compounds may be used alone or in admixture of two or more. The basic compound is preferably formulated in an amount of 0.01 to 2 parts, and especially 0.01 to 1 part by mass, per 100 parts by mass of the base resin. Less than 0.01 part of the basic compound fails to achieve the desired effects thereof, while the use of more than 2 parts would result in too low a sensitivity.

Other Components

The resist composition of the invention may include, as an optional ingredient, a surfactant which is commonly used for improving the coating characteristics. Optional ingredients may be added in conventional amounts so long as this does not compromise the objects of the invention.

Nonionic surfactants are preferred, examples of which include perfluoroalkylpolyoxyethylene ethanols, fluorinated alkyl esters, perfluoroalkylamine oxides, and fluorinated organosiloxane compounds. Useful surfactants are commercially available under the trade names Florade FC-430 and FC-431 from Sumitomo 3M K.K., Surflon S-141 and S-145 from Asahi Glass K.K., Unidine DS-401, DS-403 and DS-451 from Daikin Industry K.K., Megaface F-8151 from Dai-Nippon Ink & Chemicals K.K., and X-70-092 and X-70-093 from Shin-Etsu Chemical Co., Ltd. Preferred surfactants are Florade FC-430 from Sumitomo 3M K.K. and X-70-093 from Shin-Etsu Chemical Co., Ltd.

In forming a contact hole pattern using the chemically amplified positive resist composition of the invention, a known lithographic technique may be used. For example, the resist composition is applied onto a substrate such as a silicon wafer by spin coating or the like to form a resist film having a thickness of 0.5 to 2.0 $\mu$m, which is then prebaked on a hot plate at 60 to 150° C. for 1 to 10 minutes, and preferably at 80 to 120° C. for 1 to 5 minutes. A patterning mask having the desired contact hole pattern is then placed over the resist film,, and the film exposed through the mask to an electron beam or to high-energy radiation with a wavelength of up to 300 nm such as deep-UV rays, an excimer laser, or x-rays in a dose of about 1 to 200 mJ/cm$^2$, and preferably about 10 to 100 mJ/cm$^2$, then post-exposure baked (PEB) on a hot plate at 60 to 150° C. for 1 to 5 minutes, and preferably at 80 to 120° C. for 1 to 3 minutes. Finally, development is carried out using as the developer an aqueous alkali solution, such as a 0.1 to 5% (preferably 2 to 3%) aqueous solution of tetramethylammonium hydroxide (TMAH), this being done by a conventional method such as dipping, puddling, or spraying for a period of 0.1 to 3 minutes, and preferably 0.5 to 2 minutes. These steps result in the formation of the desired pattern on the substrate.

Then the contact hole pattern film was subjected to thermal flow by heating on a hot plate. The heating temperature is preferably 100 to 200° C., and especially 100 to 150° C. when a precision of hot plate heating is taken into account. The heating time is preferably 60 to 120 seconds.

The contact holes have a size of 0.20 to 0.30 μm at the end of exposure and development. By the thermal flow process, the contact holes are contracted to a size of 0.10 to 0.15 μm. The thermal flow process enables to form a miniature contact hole pattern.

Of the various types of high-energy radiation that may be used, the resist composition of the invention is best suited to fine pattern formation with, in particular, deep-UV rays having a wavelength of 254 to 193 nm, an excimer laser, x-rays, or an electron beam.

In the process involving the step of forming a contact hole pattern using a chemically amplified positive resist composition comprising a polymer as the base resin, and the thermal flow step of heat treating the contact hole pattern for contracting or miniaturizing the size of contact holes, the addition of a compound having at least two functional groups capable of crosslinking with the polymer to the resist composition enables easy control of the heat miniaturizing step. The process becomes adaptable and yields a precisely defined pattern profile, and thus enables formation of a microsize contact hole pattern for the fabrication of VLSIs.

EXAMPLE

Examples of the invention are given below by way of illustration and not by way of limitation. The term "pbm" is parts by mass, and PAG is a photoacid generator.

Examples & Comparative Examples

Resist materials were prepared in accordance with the formulation shown in Tables 1 and 2. The components used are shown below.

Polymer A: poly(p-hydroxystyrene) in which hydrogen atoms of hydroxyl groups are substituted with 30 mol % of 1-ethoxyethyl groups, having a weight average molecular weight of 12,000.
Polymer B: poly(p-hydroxystyrene) in which hydrogen atoms of hydroxyl groups are substituted with 15 mol % of 1-ethoxyethyl groups and 15 mol % of tert-butoxycarbonyl groups, having a weight average molecular weight of 12,000.
Polymer C: poly(p-hydroxystyrene) in which hydrogen atoms of hydroxyl groups are substituted with 30 mol % of 1-ethoxypropyl groups, having a weight average molecular weight of 13,000.
Polymer D: poly(p-hydroxystyrene) in which hydrogen atoms of hydroxyl groups are substituted with 26 mol % of 1-ethoxypropyl groups and 10 mol % of tert-butyloxycarbonylmethyl groups, having a weight average molecular weight of 13,000.
Polymer E: poly(p-hydroxystyrene) in which hydrogen atoms of hydroxyl groups are substituted with 25 mol % of 1-ethoxypropyl groups and crosslinked with 5 mol % of 1,4-butanediol divinyl ether, having a weight average molecular weight of 14,000.
Polymer F: p-hydroxystyrene-1-ethylcyclopentyl methacrylate copolymer having a compositional ratio (molar ratio) of 70:30 and a weight average molecular weight of 11,000.
Polymer G: p-hydroxystyrene-1-ethylcyclopentyl methacrylate-p-tert-butoxystyrene copolymer having a compositional ratio (molar ratio) of 60:30:10 and a weight average molecular weight of 12,000.
Polymer H: p-hydroxystyrene-p-(1-ethyloxyethyloxy) styrene-1-ethylcyclopentyl methacrylate copolymer having a compositional ratio (molar ratio) of 60:30:10 and a weight average molecular weight of 13,000.
Polymer I: p-hydroxystyrene-p-(1-ethyloxyethyloxy) styrene-tert-butyl methacrylate copolymer having a compositional ratio (molar ratio) of 60:30:10 and a weight average molecular weight of 14,000.
Polymer J: p-hydroxystyrene-p-(1-ethyloxyethyloxy) styrene-1-ethylcyclopentyl methacrylate copolymer having a compositional ratio (molar ratio) of 60:30:10 in which phenolic hydroxyl groups are crosslinked with 3 mol % of 1,4-butanediol divinyl ether, and having a weight average molecular weight of 13,000.
PAG1: (4-tert-butoxyphenyl)diphenylsulfonium p-toluenesulfonate
PAG2: (4-tert-butoxyphenyl)diphenylsulfonium 10-camphorsulfonate
PAG3: bis(tert-butylsulfonyl)diazomethane
PAG4: bis(cyclohexylsulfonyl)diazomethane
PAG5: bis(2,4-dimethylphenylsulfonyl)diazomethane
Basic compound I: tri-n-butylamine
Basic compound II: triethanolamine
Surfactant α: FC-430 (Sumitomo 3M K.K.)
Solvent 1: propylene glycol methyl ether acetate
Solvent 2: ethyl lactate

TABLE 1

| Composition (pbm) | Composition 1 | Composition 2 | Composition 3 | Composition 4 | Composition 5 | Composition 6 | Composition 7 | Composition 8 | Composition 9 |
|---|---|---|---|---|---|---|---|---|---|
| Polymer A | 80 | 80 | 80 | — | 40 | — | 40 | — | — |
| Polymer B | — | — | — | 80 | 40 | — | — | — | — |
| Polymer C | — | — | — | — | — | 80 | 40 | 40 | — |
| Polymer D | — | — | — | — | — | — | — | 40 | 80 |
| Polymer E | — | — | — | — | — | — | — | — | — |
| Polymer F | — | — | — | — | — | — | — | — | — |
| Polymer G | — | — | — | — | — | — | — | — | — |
| Polymer H | — | — | — | — | — | — | — | — | — |

TABLE 1-continued

| Composition (pbm) | Composition 1 | Composition 2 | Composition 3 | Composition 4 | Composition 5 | Composition 6 | Composition 7 | Composition 8 | Composition 9 |
|---|---|---|---|---|---|---|---|---|---|
| Polymer I | — | — | — | — | — | — | — | — | — |
| Polymer J | — | — | — | — | — | — | — | — | — |
| PAG 1 | 1.0 | 1.0 | — | 1.0 | 1.0 | 1.0 | — | — | — |
| PAG 2 | — | — | — | — | — | — | 1.0 | 1.0 | — |
| PAG 3 | 2.0 | — | — | — | — | — | — | — | — |
| PAG 4 | — | 2.0 | 1.0 | 2.0 | 2.0 | — | — | — | 1.0 |
| PAG 5 | — | — | 2.0 | — | — | 2.0 | 2.0 | 2.0 | 2.0 |
| Basic Compound I | — | — | — | 0.20 | 0.20 | — | — | 0.20 | — |
| Basic Compound II | 0.20 | 0.20 | 0.20 | — | — | 0.20 | 0.20 | — | 0.20 |
| Surfactant α | 0.15 | 0.15 | 0.15 | 0.15 | 0.15 | 0.15 | 0.15 | 0.15 | 0.15 |
| Solvent 1 | 300 | 300 | 300 | 300 | 300 | 300 | 300 | 300 | 430 |
| Solvent 2 | 130 | 130 | 130 | 130 | 130 | 130 | 130 | 130 | — |

TABLE 2

| Composition (pbm) | Composition 10 | Composition 11 | Composition 12 | Composition 13 | Composition 14 | Composition 15 | Composition 16 | Composition 17 | Composition 18 |
|---|---|---|---|---|---|---|---|---|---|
| Polymer A | — | — | — | — | — | — | — | — | — |
| Polymer B | 40 | 40 | 24 | — | 35 | — | — | — | — |
| Polymer C | — | — | — | — | — | — | — | — | — |
| Polymer D | — | — | — | — | — | — | — | — | — |
| Polymer E | 40 | 40 | 56 | — | 35 | — | — | — | — |
| Polymer F | — | — | — | 80 | 10 | — | — | — | — |
| Polymer G | — | — | — | — | — | 80 | — | — | — |
| Polymer H | — | — | — | — | — | — | 80 | — | — |
| Polymer I | — | — | — | — | — | — | — | 80 | — |
| Polymer J | — | — | — | — | — | — | — | — | 80 |
| PAG 1 | 1.0 | — | — | — | — | — | — | — | — |
| PAG 2 | — | — | — | 1.0 | 1.0 | 1.0 | 1.0 | 1.0 | 1.0 |
| PAG 3 | — | — | — | — | — | — | — | — | — |
| PAG 4 | 2.0 | 1.0 | 1.0 | — | — | — | — | — | — |
| PAG 5 | — | 2.0 | 2.0 | — | 0.6 | — | — | — | — |
| Basic Compound I | — | — | — | — | — | — | — | — | — |
| Basic Compound II | 0.20 | 0.20 | 0.20 | 0.20 | 0.20 | 0.20 | 0.20 | 0.20 | 0.20 |
| Surfactant α | 0.15 | 0.15 | 0.15 | 0.15 | 0.15 | 0.15 | 0.15 | 0.15 | 0.15 |
| Solvent 1 | 300 | 430 | 430 | 300 | 300 | 300 | 300 | 300 | 300 |
| Solvent 2 | 130 | — | — | 130 | 130 | 130 | 130 | 130 | 130 |

To the thus prepared resist solutions, compounds for controlling the flow rate in the thermal flow process according to the invention (referred to as Additive below) were added in a proportion based on the entire resist system as shown in Tables 3 to 20.

Additive 1

Additive 2

Additive 3

Additive 4

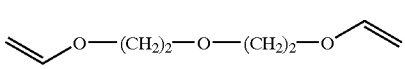

Additive 5

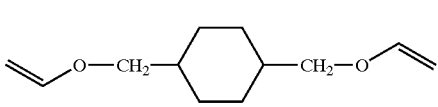

Additive 6

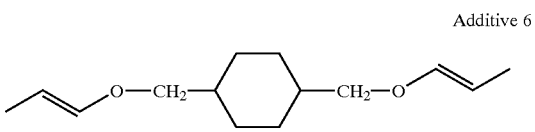

Additive 7

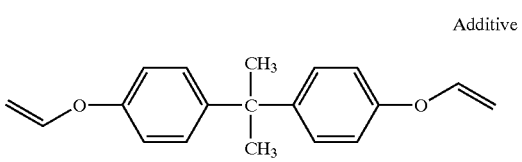

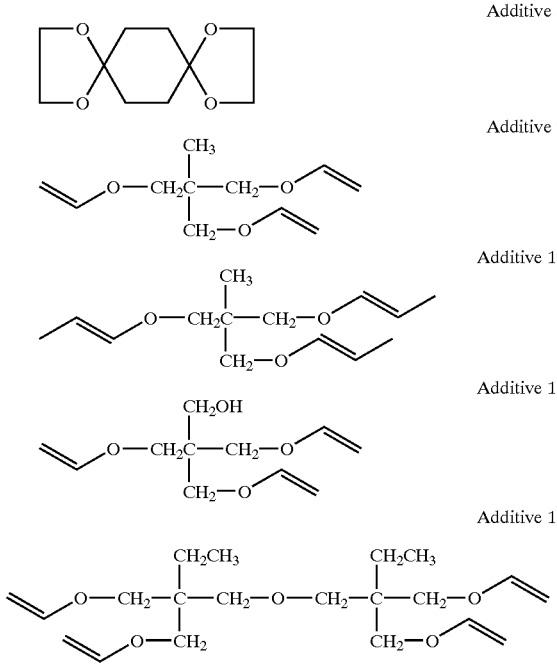

Additive 8

Additive 9

Additive 10

Additive 11

Additive 12

The resist material thus obtained was filtered through a 0.2-μm Teflon filter. The resist solution was spin-coated onto a silicon wafer, then baked at 100° C. for 90 seconds on a hot plate to give a resist film having a thickness of 0.77 μm. The resist film was exposed using an excimer laser stepper NSR-S202A (Nikon K.K., NA 0.6) with a contact hole pattern reticle mounted thereon, then baked (PEB) at 110° C. for 90 seconds, and developed with a solution of 2.38% TMAH in water, thereby giving a contact hole pattern. The target was contact holes having a size of 0.25 μm and a pitch of 1:2 at the end of development.

In this way, contact hole patterns were formed by coating resist materials onto several tens of silicon wafers. Thereafter, heat treatment was carried out for thermal flow, that is, for contracting the contact holes. The heat treatment continued for 90 seconds on a hot plate while the temperature was changed at intervals of 2° C. among the wafers.

The size of contact holes at the end of heat treatment was measured using a scanning electron microscope (Top Down SEM). The measured data were plotted in a graph with the heat treating temperature on the abscissa and the contact hole size on the ordinate. The contact hole size was 0.25 μm prior to the heat treatment, and the temperature at which the contact hole size reached 0.15 μm was determined from the graph.

Also the gradient of thermal flow (flow rate) at the 0.15 μm size was determined from the graph. It is judged that a lower flow rate is better because the thermal flow process is more effectively controllable. Additionally, the presence of scum on the resist surface was examined under Top Down SEM and after the resist pattern was sectioned, the inclusion of scum within the resist pattern was examined under a scanning electron microscope (Cross Sectional SEM). The cross-sectional shape of contact holes was observed under Cross Sectional SEM. A composition giving perpendicular contact hole sidewalls is judged effective.

Similar resist compositions without the inventive additives are Comparative Examples. The results of evaluation are shown in Tables 21 to 38.

TABLE 3

| Example | Resist composition | Additive | Addition amount (%) |
|---|---|---|---|
| Example 1 | Composition 1 | Additive 1 | 0.5 |
| Example 2 | Composition 1 | Additive 1 | 0.8 |
| Example 3 | Composition 1 | Additive 1 | 1.6 |
| Example 4 | Composition 1 | Additive 2 | 0.5 |
| Example 5 | Composition 1 | Additive 2 | 0.8 |
| Example 6 | Composition 1 | Additive 2 | 1.6 |
| Example 7 | Composition 1 | Additive 3 | 0.5 |
| Example 8 | Composition 1 | Additive 3 | 0.8 |
| Example 9 | Composition 1 | Additive 3 | 1.6 |
| Example 10 | Composition 1 | Additive 5 | 0.5 |
| Example 11 | Composition 1 | Additive 5 | 0.8 |
| Example 12 | Composition 1 | Additive 5 | 1.6 |
| Example 13 | Composition 1 | Additive 9 | 0.5 |
| Example 14 | Composition 1 | Additive 9 | 0.8 |
| Example 15 | Composition 1 | Additive 9 | 1.6 |
| Example 16 | Composition 1 | Additive 12 | 0.8 |
| CE 1 | Composition 1 | — | 0 |

TABLE 4

| Example | Resist composition | Additive | Addition amount (%) |
|---|---|---|---|
| Example 17 | Composition 2 | Additive 6 | 0.8 |
| Example 18 | Composition 2 | Additive 8 | 0.8 |
| Example 19 | Composition 2 | Additive 10 | 0.8 |
| CE 2 | Composition 2 | — | 0 |

TABLE 5

| Example | Resist composition | Additive | Addition amount (%) |
|---|---|---|---|
| Example 21 | Composition 3 | Additive 2 | 0.8 |
| Example 22 | Composition 3 | Additive 3 | 0.8 |
| Example 23 | Composition 3 | Additive 4 | 0.5 |
| Example 24 | Composition 3 | Additive 4 | 0.8 |
| Example 25 | Composition 3 | Additive 4 | 1.6 |
| Example 26 | Composition 3 | Additive 6 | 1.6 |
| Example 27 | Composition 3 | Additive 10 | 0.5 |
| Example 28 | Composition 3 | Additive 10 | 0.8 |
| Example 29 | Composition 3 | Additive 10 | 1.6 |
| CE 3 | Composition 3 | — | 0 |

TABLE 6

| Example | Resist composition | Additive | Addition amount (%) |
|---|---|---|---|
| Example 30 | Composition 4 | Additive 5 | 1.6 |
| CE 4 | Composition 4 | — | 0 |

TABLE 7

| Example | Resist composition | Additive | Addition amount (%) |
|---|---|---|---|
| Example 31 | Composition 5 | Additive 1 | 1.6 |
| Example 32 | Composition 5 | Additive 2 | 1.6 |
| Example 33 | Composition 5 | Additive 3 | 1.6 |
| Example 34 | Composition 5 | Additive 5 | 1.6 |
| Example 35 | Composition 5 | Additive 7 | 1.6 |
| Example 36 | Composition 5 | Additive 8 | 1.6 |
| Example 37 | Composition 5 | Additive 9 | 1.6 |
| CE 5 | Composition 5 | — | 0 |

TABLE 8

| Example | Resist composition | Additive | Addition amount (%) |
|---|---|---|---|
| Example 38 | Composition 6 | Additive 1 | 1.6 |
| Example 39 | Composition 6 | Additive 2 | 1.6 |
| Example 40 | Composition 6 | Additive 3 | 1.6 |
| Example 41 | Composition 6 | Additive 6 | 1.6 |
| Example 42 | Composition 6 | Additive 7 | 1.6 |
| Example 43 | Composition 6 | Additive 8 | 1.6 |
| Example 44 | Composition 6 | Additive 11 | 1.6 |
| CE 6 | Composition 6 | — | 0 |

TABLE 9

| Example | Resist composition | Additive | Addition amount (%) |
|---|---|---|---|
| Example 45 | Composition 7 | Additive 1 | 2.4 |
| Example 46 | Composition 7 | Additive 2 | 2.4 |
| Example 47 | Composition 7 | Additive 3 | 2.4 |
| Example 48 | Composition 7 | Additive 5 | 2.4 |
| Example 49 | Composition 7 | Additive 9 | 1.6 |
| Example 50 | Composition 7 | Additive 12 | 1.6 |
| CE 7 | Composition 7 | — | 0 |

TABLE 10

| Example | Resist composition | Additive | Addition amount (%) |
|---|---|---|---|
| Example 51 | Composition 8 | Additive 10 | 0.8 |
| CE 8 | Composition 8 | — | 0 |

TABLE 11

| Example | Resist composition | Additive | Addition amount (%) |
|---|---|---|---|
| Example 52 | Composition 9 | Additive 5 | 0.8 |
| Example 53 | Composition 9 | Additive 11 | 0.8 |
| CE 9 | Composition 9 | — | 0 |

TABLE 12

| Example | Resist composition | Additive | Addition amount (%) |
|---|---|---|---|
| Example 54 | Composition 10 | Additive 1 | 1.6 |
| Example 55 | Composition 10 | Additive 2 | 1.6 |
| Example 56 | Composition 10 | Additive 3 | 1.6 |
| Example 57 | Composition 10 | Additive 5 | 1.6 |
| Example 58 | Composition 10 | Additive 10 | 1.6 |
| CE 10 | Composition 10 | — | 0 |

TABLE 13

| Example | Resist composition | Additive | Addition amount (%) |
|---|---|---|---|
| Example 59 | Composition 11 | Additive 1 | 1.6 |
| Example 60 | Composition 11 | Additive 2 | 1.6 |
| Example 61 | Composition 11 | Additive 3 | 1.6 |
| Example 62 | Composition 11 | Additive 5 | 1.6 |
| Example 63 | Composition 11 | Additive 10 | 1.6 |
| CE 11 | Composition 11 | — | 0 |

TABLE 14

| Example | Resist composition | Additive | Addition amount (%) |
|---|---|---|---|
| Example 64 | Composition 12 | Additive 1 | 1.6 |
| Example 65 | Composition 12 | Additive 2 | 1.6 |
| Example 66 | Composition 12 | Additive 3 | 1.6 |
| Example 67 | Composition 12 | Additive 5 | 1.6 |
| Example 68 | Composition 12 | Additive 10 | 1.6 |
| CE 12 | Composition 12 | — | 0 |

TABLE 15

| Example | Resist composition | Additive | Addition amount (%) |
|---|---|---|---|
| Example 69 | Composition 13 | Additive 6 | 1.6 |
| Example 70 | Composition 13 | Additive 10 | 1.6 |
| CE 13 | Composition 13 | — | 0 |

TABLE 16

| Example | Resist composition | Additive | Addition amount (%) |
|---|---|---|---|
| Example 71 | Composition 14 | Additive 6 | 1.6 |
| Example 72 | Composition 14 | Additive 10 | 1.6 |
| Example 73 | Composition 14 | Additive 12 | 0.8 |
| CE 14 | Composition 14 | — | 0 |

TABLE 17

| Example | Resist composition | Additive | Addition amount (%) |
|---|---|---|---|
| Example 74 | Composition 15 | Additive 6 | 1.6 |
| Example 75 | Composition 15 | Additive 10 | 1.6 |
| CE 15 | Composition 15 | — | 0 |

TABLE 18

| Example | Resist composition | Additive | Addition amount (%) |
|---|---|---|---|
| Example 76 | Composition 16 | Additive 6 | 1.6 |
| Example 77 | Composition 16 | Additive 10 | 0.8 |
| CE 16 | Composition 16 | — | 0 |

TABLE 19

| Example | Resist composition | Additive | Addition amount (%) |
|---|---|---|---|
| Example 78 | Composition 17 | Additive 6 | 1.6 |
| Example 79 | Composition 17 | Additive 10 | 0.8 |
| CE 17 | Composition 17 | — | 0 |

TABLE 20

| Example | Resist composition | Additive | Addition amount (%) |
|---|---|---|---|
| Example 80 | Composition 18 | Additive 6 | 1.6 |
| Example 81 | Composition 18 | Additive 10 | 0.8 |
| CE 18 | Composition 18 | — | 0 |

In the following Tables, the "heating temperature" is the heating temperature for thermal flow at which the contact hole of 0.25 $\mu$m size was contracted to 0.15 $\mu$m; and the "contact hole shape" is the cross-sectional shape of contact holes after the thermal flow.

TABLE 21

| | Heating Temperature (° C.) | Flow rate (nm/° C.) | Scum on or in resist pattern | Contact hole shape |
|---|---|---|---|---|
| Example 1 | 128 | 12.5 | nil | slightly bowed |
| Example 2 | 128 | 11.4 | nil | perpendicular |
| Example 3 | 126 | 8.6 | nil | perpendicular |
| Example 4 | 124 | 16.5 | nil | slightly bowed |
| Example 5 | 124 | 13.0 | nil | perpendicular |
| Example 6 | 124 | 11.1 | nil | perpendicular |
| Example 7 | 124 | 16.1 | nil | slightly bowed |
| Example 8 | 124 | 14.0 | nil | perpendicular |
| Example 9 | 122 | 10.8 | nil | perpendicular |
| Example 10 | 126 | 12.1 | nil | slightly bowed |
| Example 11 | 126 | 11.0 | nil | perpendicular |
| Example 12 | 126 | 10.0 | nil | perpendicular |
| Example 13 | 124 | 9.0 | some scum observed | perpendicular |
| Example 14 | 124 | 7.3 | some scum observed | perpendicular |
| Example 15 | 122 | 5.4 | some scum observed | perpendicular |
| Example 16 | 120 | 5.3 | some scum observed | perpendicular |
| CE 1 | 130 | 19.0 | nil | bowed |

TABLE 22

| | Heating Temperature (° C.) | Flow rate (nm/° C.) | Scum on or in resist pattern | Contact hole shape |
|---|---|---|---|---|
| Example 17 | 126 | 11.2 | nil | perpendicular |
| Example 18 | 126 | 11.1 | nil | perpendicular |
| Example 19 | 126 | 5.8 | nil | perpendicular |
| CE 2 | 130 | 19.0 | nil | bowed |

TABLE 23

| | Heating Temperature (° C.) | Flow rate (nm/° C.) | Scum on or in resist pattern | Contact hole shape |
|---|---|---|---|---|
| Example 20 | 120 | 10.1 | nil | perpendicular |
| Example 21 | 120 | 10.3 | nil | perpendicular |
| Example 22 | 120 | 13.8 | nil | slightly bowed |
| Example 23 | 120 | 12.6 | nil | perpendicular |
| Example 24 | 118 | 10.0 | nil | perpendicular |
| Example 25 | 126 | 8.9 | nil | perpendicular |
| Example 26 | 118 | 9.0 | nil | perpendicular |
| Example 27 | 118 | 7.8 | some scum observed | perpendicular |
| Example 28 | 116 | 5.4 | some scum observed | perpendicular |
| CE 3 | 124 | 19.2 | nil | bowed |

TABLE 24

| | Heating Temperature (° C.) | Flow rate (nm/° C.) | Scum on or in resist pattern | Contact hole shape |
|---|---|---|---|---|
| Example 29 | 160 | 8.8 | nil | perpendicular |
| CE 4 | 162 | 17.8 | nil | bowed |

TABLE 25

| | Heating Temperature (° C.) | Flow rate (nm/° C.) | Scum on or in resist pattern | Contact hole shape |
|---|---|---|---|---|
| Example 30 | 154 | 8.0 | nil | perpendicular |
| Example 31 | 154 | 8.2 | nil | perpendicular |
| Example 32 | 154 | 8.3 | nil | perpendicular |
| Example 33 | 152 | 8.8 | nil | perpendicular |
| Example 34 | 150 | 10.1 | nil | perpendicular |
| Example 35 | 148 | 9.2 | nil | perpendicular |
| Example 36 | 148 | 5.0 | some scum observed | perpendicular |
| CE 5 | 162 | 18.1 | nil | bowed |

TABLE 26

| | Heating Temperature (° C.) | Flow rate (nm/° C.) | Scum on or in resist pattern | Contact hole shape |
|---|---|---|---|---|
| Example 37 | 128 | 8.0 | nil | perpendicular |
| Example 38 | 128 | 8.2 | nil | perpendicular |
| Example 39 | 128 | 8.3 | nil | perpendicular |
| Example 40 | 126 | 8.8 | nil | perpendicular |
| Example 41 | 130 | 10.1 | nil | perpendicular |
| Example 42 | 130 | 9.2 | nil | perpendicular |
| Example 43 | 126 | 5.0 | some scum observed | perpendicular |
| CE 6 | 128 | 19.4 | nil | bowed |

TABLE 27

| | Heating Temperature (° C.) | Flow rate (nm/° C.) | Scum on or in resist pattern | Contact hole shape |
|---|---|---|---|---|
| Example 44 | 124 | 6.3 | nil | perpendicular |
| Example 45 | 124 | 6.4 | nil | perpendicular |
| Example 46 | 122 | 6.5 | nil | perpendicular |
| Example 47 | 120 | 5.9 | nil | perpendicular |
| Example 48 | 126 | 5.9 | some scum observed | perpendicular |
| Example 49 | 128 | 4.0 | scum observed | perpendicular |
| CE 7 | 126 | 19.5 | nil | bowed |

TABLE 28

| | Heating Temperature (° C.) | Flow rate (nm/° C.) | Scum on or in resist pattern | Contact hole shape |
|---|---|---|---|---|
| Example 50 | 148 | 7.3 | nil | perpendicular |
| CE 8 | 146 | 18.8 | nil | bowed |

TABLE 29

| | Heating Temperature (° C.) | Flow rate (nm/° C.) | Scum on or in resist pattern | Contact hole shape |
|---|---|---|---|---|
| Example 51 | 138 | 11.6 | nil | perpendicular |
| Example 52 | 132 | 7.5 | nil | perpendicular |
| CE 9 | 136 | 19.3 | nil | bowed |

TABLE 30

| | Heating Temperature (° C.) | Flow rate (nm/° C.) | Scum on or in resist pattern | Contact hole shape |
|---|---|---|---|---|
| Example 53 | 148 | 8.7 | nil | perpendicular |
| Example 54 | 148 | 8.8 | nil | perpendicular |
| Example 55 | 148 | 9.2 | nil | perpendicular |
| Example 56 | 146 | 8.5 | nil | perpendicular |
| Example 57 | 146 | 5.4 | some scum observed | perpendicular |
| CE 10 | 144 | 17.0 | nil | bowed |

TABLE 31

| | Heating Temperature (° C.) | Flow rate (nm/° C.) | Scum on or in resist pattern | Contact hole shape |
|---|---|---|---|---|
| Example 58 | 150 | 8.9 | nil | perpendicular |
| Example 59 | 150 | 9.1 | nil | perpendicular |
| Example 60 | 150 | 9.7 | nil | perpendicular |
| Example 61 | 148 | 8.8 | nil | perpendicular |
| Example 62 | 146 | 5.5 | some scum observed | perpendicular |
| CE 11 | 146 | 17.2 | nil | bowed |

TABLE 32

| | Heating Temperature (° C.) | Flow rate (nm/° C.) | Scum on or in resist pattern | Contact hole shape |
|---|---|---|---|---|
| Example 63 | 147 | 8.4 | nil | perpendicular |
| Example 64 | 149 | 8.5 | nil | perpendicular |
| Example 65 | 149 | 9.3 | nil | perpendicular |
| Example 66 | 149 | 8.6 | nil | perpendicular |
| Example 67 | 153 | 5.6 | some scum observed | perpendicular |
| CE 12 | 152 | 18.0 | nil | bowed |

TABLE 33

| | Heating Temperature (° C.) | Flow rate (nm/° C.) | Scum on or in resist pattern | Contact hole shape |
|---|---|---|---|---|
| Example 68 | 176 | 7.9 | nil | perpendicular |
| Example 69 | 178 | 3.9 | nil | perpendicular |
| CE 13 | 176 | 17.8 | nil | bowed |

TABLE 34

| | Heating Temperature (° C.) | Flow rate (nm/° C.) | Scum on or in resist pattern | Contact hole shape |
|---|---|---|---|---|
| Example 70 | 160 | 9.0 | nil | perpendicular |
| Example 71 | 154 | 5.1 | some scum observed | perpendicular |
| Example 72 | 158 | 4.9 | some scum observed | perpendicular |
| CE 14 | 158 | 16.9 | nil | bowed |

TABLE 35

| | Heating Temperature (° C.) | Flow rate (nm/° C.) | Scum on or in resist pattern | Contact hole shape |
|---|---|---|---|---|
| Example 73 | 180 | 9.3 | nil | perpendicular |
| Example 74 | 180 | 5.4 | some scum observed | perpendicular |
| CE 15 | 180 | 17.3 | nil | bowed |

TABLE 36

| | Heating Temperature (° C.) | Flow rate (nm/° C.) | Scum on or in resist pattern | Contact hole shape |
|---|---|---|---|---|
| Example 75 | 156 | 8.5 | nil | perpendicular |
| Example 76 | 156 | 7.0 | some scum observed | perpendicular |
| CE 16 | 156 | 17.0 | nil | bowed |

TABLE 37

| | Heating Temperature (° C.) | Flow rate (nm/° C.) | Scum on or in resist pattern | Contact hole shape |
|---|---|---|---|---|
| Example 77 | 162 | 8.5 | nil | perpendicular |
| Example 78 | 156 | 7.2 | some scum observed | perpendicular |
| CE 17 | 160 | 17.8 | nil | bowed |

TABLE 38

| | Heating Temperature (° C.) | Flow rate (nm/° C.) | Scum on or in resist pattern | Contact hole shape |
|---|---|---|---|---|
| Example 79 | 146 | 7.8 | nil | perpendicular |
| Example 80 | 150 | 7.4 | some scum observed | perpendicular |
| CE 18 | 152 | 17.4 | nil | bowed |

Japanese Patent Application No. 11-323332 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A chemically amplified positive resist composition for forming a contact hole pattern by a thermal flow process, comprising a base resin in the form of a polymer having acid labile groups and a compound containing at least two functional groups of the formulae (1)-a to (1)-c,

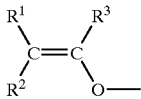
(1)-a

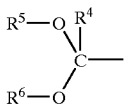
(1)-b

(1)-c wherein $R^1$ to $R^4$ are, independently, hydrogen or a straight, branched or cyclic alkyl group of 1 to 12 carbon atoms, $R^5$ to $R^9$ are, independently, a straight, branched or cyclic alkyl group of 1 to 12 carbon atoms, and a pair of $R^1$ and $R^3$, a pair of $R^4$ and $R^5$, a pair of $R^5$ and $R^6$, a pair of $R^7$ and $R^8$, a pair of $R^7$ and $R^9$ or a pair of $R^8$ and $R^9$, taken together, optionally form a ring.

2. A resist composition of claim 1, wherein the compound containing at least two functional groups is of formula (2):

[X]–[Z]$_k$ wherein z is a functional group of formulae (1)-a to (1)-c, the Z's are the same or different, k is a positive integer of 2 to 6, and x is a k-valent organic group of 2 to 20 carbon atoms.

3. A resist composition of claim 2, wherein the compound of formula (2) is present in an amount of 0.1 to 5% by mass of the overall resist composition.

4. A resist composition of claim 2, wherein x is a substituted or unsubstituted, aliphatic, alicyclic or aromatic hydrocarbon group, that is optionally separated by a hetero atom.

5. A chemically amplified positive resist composition for forming a contact hole pattern by a thermal flow process, comprising (A) an organic solvent, (B) a base resin in the form of a polymer having acid labile groups, (C) a photoacid generator, (D) a basic compound, and (E) a compound of claim 1 containing at least two functional groups of the formulae (1)-a to (1)-c.

6. a resist composition of claim 5, wherein the base resin (B) is a polymer comprising recurring units of formula (3) in which some of the hydrogen atoms of the phenolic hydroxyl groups are replaced by acid labile groups of at least one type, and some of the hydrogen atoms of the remaining phenolic hydroxyl groups are optionally eliminated for crosslinkage within a molecule and/or between molecules with crosslinking groups having C—O—C linkages, wherein the total of the acid labile groups and the crosslinking groups is more than 0 mol % to 80 mol % of the hydrogen atoms of phenolic hydroxyl groups in the formula (3), said polymer has a weight average molecular weight of 1,000 to 500,000,

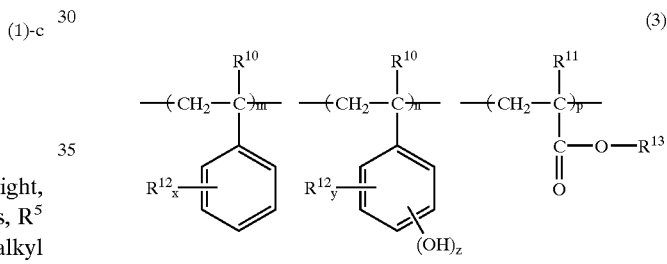
(3)

wherein $R^{10}$ is hydrogen or methyl, $R^{11}$ is hydrogen or a methyl, phenyl or cyano group, $R^{12}$ is a straight, branched or cyclic alkyl group of 1 to 8 carbon atoms, $R^{13}$ is hydrogen or a straight, branched or cyclic alkyl group of 1 to 10 carbon atoms, x is 0 or a positive integer of up to 5, y and z are positive integers satisfying $y+z \leq 5$, m and p are 0 or positive number, n is a positive number, satisfying $0 \leq m/(m+n+p) \leq 0.8$, $0 < n/(m+n+p) \leq 1$, and $0 \leq p/(m+n+p) \leq 0.8$.

7. A resist composition of claim 6, wherein the base resin (B) is a polymer of formula (4), that is a polymer comprising recurring units of formula (3) in which some of the hydrogen atoms of the phenolic hydroxyl groups are replaced by acid labile groups of at least one type, and some of the hydrogen atoms of the remaining phenolic hydroxyl groups are optionally eliminated for crosslinkage within a molecule and/or between molecules with crosslinking groups having C—O—C linkages, wherein the total of the acid labile groups and the crosslinking groups is more than 0 mol % to 80 mol % of the hydrogen atoms of phenolic hydroxyl groups in formula (3), said polymer has a weight average molecular weight of 1,000 to 500,000,

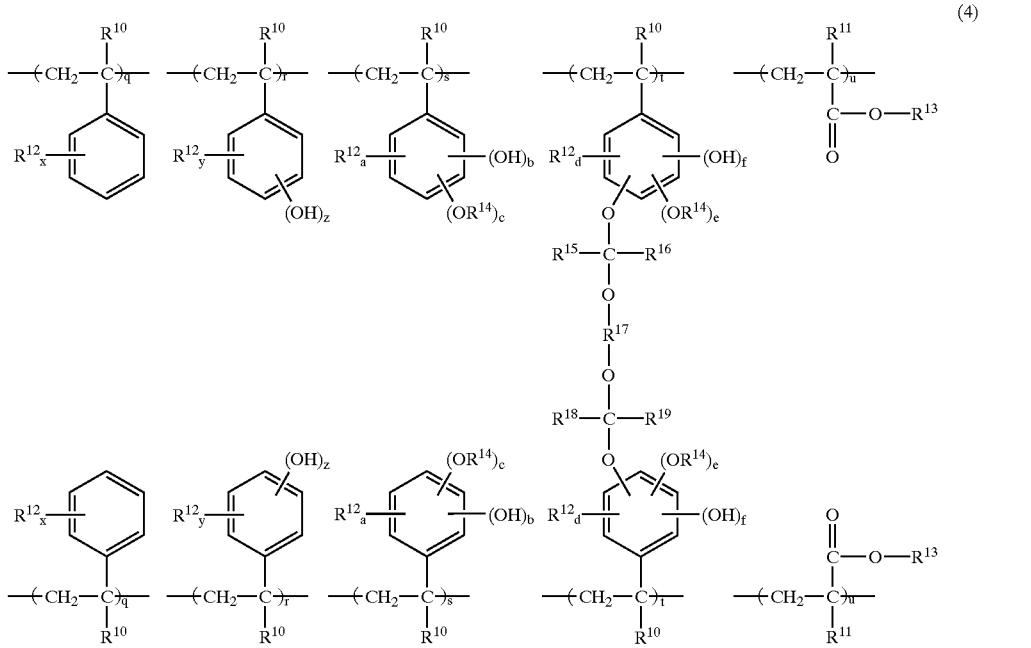

(4)

wherein
  R$^{10}$ is hydrogen or methyl, R$^{11}$ is hydrogen or a methyl, phenyl or cyano group, R$^{12}$ is a straight, branched or cyclic alkyl group of 1 to 8 carbon atoms, R$^{13}$ is hydrogen or a straight, branched or cyclic alkyl group of 1 to 10 carbon atoms, R$^{14}$ is an acid labile group of at least one type, R$^{15}$, R$^{16}$, R$^{18}$ and R$^{19}$ are, independently, hydrogen or straight, branched or cyclic alkyl groups of 1 to 6 carbon atoms, and R$^{17}$ is a divalent or polyvalent hydrocarbon group of 1 to 10 carbon atoms which is optionally separated by an oxygen atom,
  each unit has the same or different substituents,
  x is 0 or a positive integer of up to 5, y and z are positive integers satisfying y+z≦5, a, b and c are positive integers satisfying a+b+c≦5, with the proviso that c is not equal to 0, d, e and f are 0 or positive integers satisfying d+e+f≦4,
  q, t and u are 0 or positive numbers, r and s are positive numbers, satisfying 0≦q/(q+r+s+t+u)≦0.8, 0≦s/(q+r+s+t+u)≦0.8, 0≦t/(q+r+s+t+u)≦0.8, 0≦u/(q+r+s+t+u)≦0.8, 0≦(r+s+t)/(q+r+s+t+u)≦1, and 0<r/(q+r+s+t+u)≦0.8.

8. a resist composition of claim 7, wherein the base resin (B) is a polymer of formula (5), that is a polymer comprising recurring units of formula (3) in which some of the hydrogen atoms of the phenolic hydroxyl groups are replaced by acid labile groups of at least one type, and some of the hydrogen atoms of the remaining phenolic hydroxyl groups are optionally eliminated for crosslinkage within a molecule and/or between molecules with crosslinking groups having C—O—C linkages, wherein the total of the acid labile groups and the crosslinking groups is more than 0 mol % to 80 mol % of the hydrogen atoms of phenolic hydroxyl groups in formula (3), said polymer has a weight average molecular weight of 1,000 to 500,000,

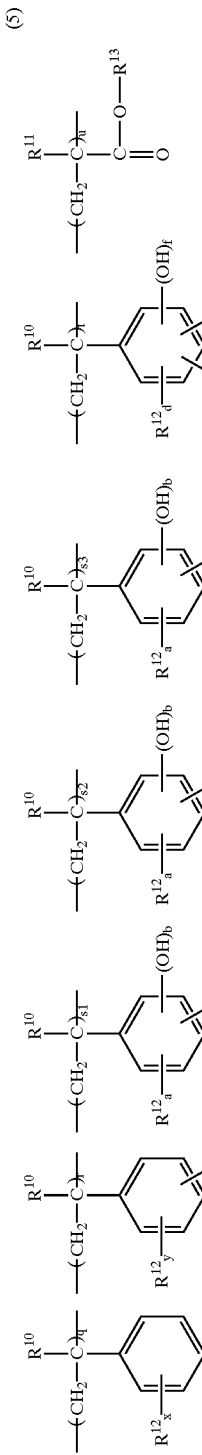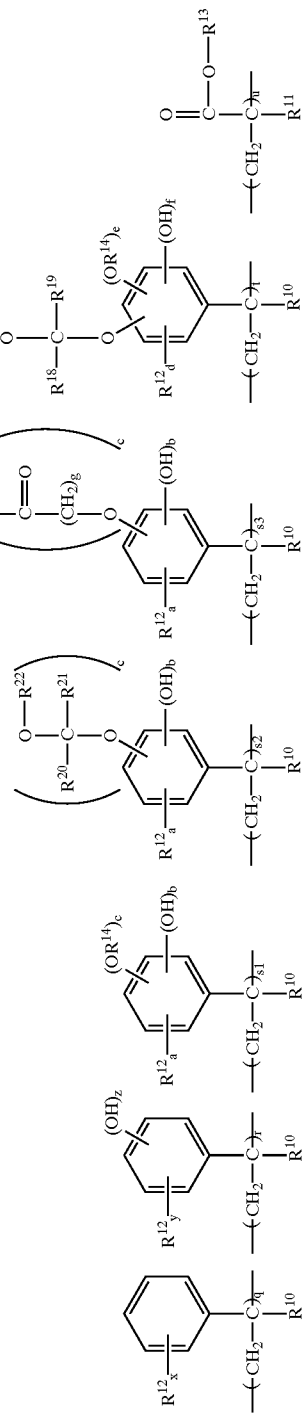

wherein

R$^{11}$, R$^{12}$, R$^{13}$, R$^{14}$, R$^{15}$, R$^{16}$, R$^{17}$, R$^{18}$, R$^{19}$, x, y, z, a, b, c, d, e, and f are as defined above, R$^{21}$ and R$^{22}$ are, independently, hydrogen or a straight, branched or cyclic alkyl group of 1 to 8 carbon atoms, R$^{23}$ is a monovalent hydrocarbon group of 1 to 18 carbon atoms which optionally contains a hetero atom, a pair of R$^{21}$ and R$^{22}$, a pair of R$^{21}$ and R$^{23}$ or a pair of R$^{22}$ and R$^{23}$, taken together, optionally form a ring, wherein each of R$^{21}$, R$^{22}$ and R$^{23}$ is a straight or branched alkylene group of 1 to 8 carbon atoms when they form a ring, R$^{24}$ is a tertiary alkyl group of 4 to 20 carbon atoms, g is 0 or a positive integer of 1 to 6, q, s1, s2, s3, t and u are 0 or positive numbers, r is a positive number, satisfying $0 \leq q/(q+r+s1+s2+s3+t+u) \leq 0.8$, $0 \leq s1/(q+r+s1+s2+s3+t+u) \leq 0.8$, $0 \leq s2/(q+r+s1+s2+s3+t+u) \leq 0.8$, $0 \leq s3/(q+r+s1+s2+s3+t+u) \leq 0.8$, $0 < (s1+s2+s3)/(q+r+s1+s2+s3+t+u) \leq 0.8$, $0 \leq t/(q+r+s1+s2+s3+t+u) \leq 0.8$, $0 \leq u/(q+r+s1+s2+s3+t+u) \leq 0.8$, $0 < (r+s1+s2+s3+t)/(q+r+s1+s2+s3+t+u) \leq 1$, and $0 < r/(q+r+s1+s2+s3+t+u) \leq 0.8$.

9. A resist composition of claim 6, wherein the total of the acid labile groups and the crosslinking groups is 2 to 50 mol % of the hydrogen atoms of the phenolic hydroxyl groups.

10. A resist composition according to claim 6, wherein the amount of acid labile groups is more than 0 mol % to 80 mol %, and the amount of the crosslinking groups is more than 0 mol % to 50 mol % of the hydrogen atoms of the phenolic hydroxyl groups.

11. A resist composition of claim 6, wherein the amount of the acid labile groups is 10 to 50 mol %, and the amount of the crosslinking groups is 0.2 to 20 mol % of the hydrogen atoms of the phenolic hydroxyl groups.

12. A resist composition of claim 5, wherein component (C) is an onium salt or a diazomethane derivative or both.

13. A resist composition of claim 5, wherein component (D) is an aliphatic amine.

14. A process for forming a contact hole pattern, comprising (i) applying a chemically amplified positive resist composition of claim 1 onto a substrate to form a coating, (ii) heat treating the coating and exposing the coating to high energy radiation with a wavelength of up to 300 nm or electron beam through a photo-mask, (iii) optionally heat treating the exposed coating, and developing the coating with a developer, thereby forming a contact hole pattern, and (iv) farther heat treating the contact hole pattern for reducing the size of contact holes.

15. A resist composition of claim 1, wherein the group of formula (1)-a is vinyloxy, propenyloxy, isopropenyloxy,

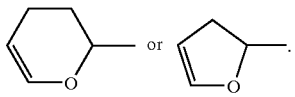

16. A resist composition of claim 1, wherein the group of formula (1)-b is selected from the group consisting of

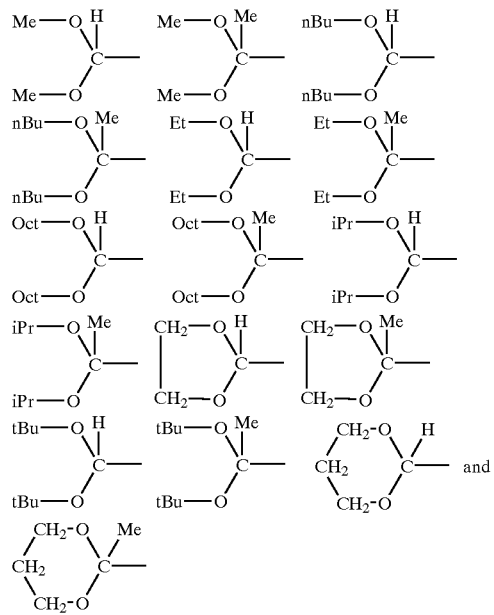

wherein Me is methyl, Et is ethyl, iPr is isopropyl, nBu is n-butyl, tBu is tert-butyl, and Oct is octyl.

17. A resist composition of claim 1, wherein the group of formula (1)-c is selected from the groups consisting of

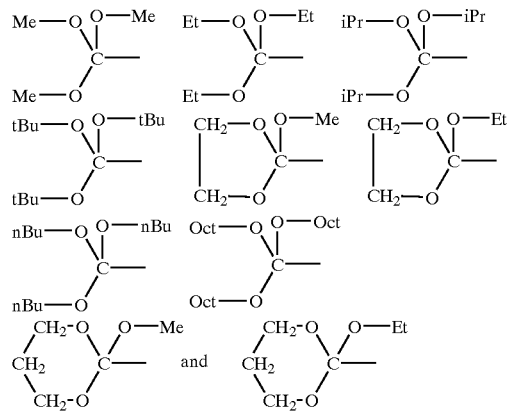

wherein Me is methyl, Et is ethyl, iPr is isopropyl, nBu is n-butyl, tBu is tert-butyl, and Oct is octyl.

* * * * *